US006759177B2

(12) United States Patent
Shimada et al.

(10) Patent No.: US 6,759,177 B2
(45) Date of Patent: Jul. 6, 2004

(54) PHOTOSENSITIVE COMPOSITION AND PLANOGRAPHIC PRINTING PLATE PRECURSOR

(75) Inventors: Kazuto Shimada, Shizuoka-ken (JP); Tadahiro Sorori, Shizuoka-ken (JP); Morio Yagihara, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 42 days.

(21) Appl. No.: 10/146,465

(22) Filed: May 16, 2002

(65) Prior Publication Data

US 2003/0054288 A1 Mar. 20, 2003

(30) Foreign Application Priority Data

May 17, 2001 (JP) ....................................... 2001-147429
Sep. 4, 2001 (JP) ....................................... 2001-266921

(51) Int. Cl.$^{7}$ ................................................ G03F 7/038

(52) U.S. Cl. ............................... 430/270.1; 430/281.1; 430/286.1

(58) Field of Search ................................ 430/157, 163, 430/270.1, 271.1, 281.1, 286.1

(56) References Cited

U.S. PATENT DOCUMENTS 6,623,910 B2 * 9/2003 Shimada et al. ......... 430/270.1
2001/0036598 A1 * 11/2001 Shimada et al. ......... 430/281.1
2002/0072011 A1 * 6/2002 Murota et al. ........... 430/273.1
2003/0198893 A1 * 10/2003 Oshima ................... 430/273.1

* cited by examiner

*Primary Examiner*—Mark F. Huff
*Assistant Examiner*—Barbara Gilliam
(74) *Attorney, Agent, or Firm*—Sughrue Mion, PLLC

(57) ABSTRACT

This invention describes a heat sensitive composition comprising: (A-I) a compound which is represented by the following general formula (I) and generates a radical when heated, and (B-I) a compound having physical and chemical properties that are changed irreversibly by a radical, $$R—SO_2^-M^+ \qquad \text{General formula (I)}$$

wherein R represents an alkyl group or aryl group, and $M^+$ represents a counter cation selected from sulfonium, iodonium, diazonium, ammonium and azinium; and a negative planographic printing plate precursor which can be recorded by heat mode using this composition. This invention also describes a planographic printing plate precursor comprising a substrate having disposed thereon a photosensitive layer containing (C-II) a light-heat converting agent, (B-II) a compound having a polymerizable unsaturated group, and (A-II) an onium salt having at least two cation parts in one molecule.

10 Claims, No Drawings

PHOTOSENSITIVE COMPOSITION AND PLANOGRAPHIC PRINTING PLATE PRECURSOR

BACKGROUND OF THE INVENTION

1. Field of the Invention

The present invention relates to a heat sensitive composition applicable widely as a heat sensitive recording material, and a planographic printing plate precursor having a negative recording layer comprising the composition and inscribable at high sensitivity by infrared laser.

Further, the present invention relates to a planographic printing plate precursor inscribable by infrared laser, more specifically, to a planographic printing plate precursor which can form a planographic printing plate excellent in recording sensitivity.

2. Description of the Related Art

Recent development in laser is remarkable, and particularly, in solid laser and semiconductor laser which emit a light having a range from a near infrared ray to infrared ray, and progresses thereof have been made in high output and decrease in size. Therefore, these lasers are very useful as a light source for exposure in direct plate making from digital data from a computer and the like.

A negative planographic printing plate material used for infrared laser such as those described above as the light source is a planographic printing plate material having a photosensitive layer containing an infrared ray absorbing agent or light-heat converting agent, a polymerization initiator which generates a radical by the action of light or heat, and a polymerizable compound.

Usually, such a negative image recording material utilizes a recording method in which a polymerization reaction is caused by using a radical which is generated by the action of light or heat, as the initiator, and exposed portions of a recording layer is harden to form an image portion. An image forming property of the negative image forming material is low as compared with those of a positive image forming material which cause solubilization of a recording layer due to energy of infrared laser irradiation. Therefore, in general, heating treatment before a development process is proceeded for the negative image forming material in order to form a strong image portion by promoting a hardening reaction in polymerization. As the negative image recording material in which such post heating treatment is conducted, for example, recording materials comprised of a resol resin, novolak resin, infrared absorber, and acid generator are described in U.S. Pat. No. 5,340,699 and the like.

However, in such a negative image recording material, heating treatment at 140 to 200° C. for 50 to 120 seconds after exposure to laser light is required. Therefore, a large scale apparatus and energy is required for the heating treatment after exposure.

Further, when an aluminum substrate is used, energy of an infrared laser irradiation is diffused into the substrate having high heat conductivity, and the energy is not utilized for initiation and promotion for a polymerization reaction to form images, consequently, sufficient sensitivity is not obtained.

Further, Japanese Patent Application Publication (JP-B) No. 7-103171 disclosed a recording material requiring no heating treatment after image-wise exposure, the material being comprised of a cyanine coloring material having a specific structure, an iodonium salt and an addition-polymerizable compound having an ethylenically unsaturated double bond. However, this image recording material has a problem such that polymerization inhibition is caused by oxygen in the air at the time of a polymerization reaction, and sufficient sensitivity is not obtained. Furthermore, Japanese Patent Application Laid-Open (JP-A) No. 8-108621 disclosed that an image recording media containing a thermal polymerizable resin, and an organic peroxide or azobisnitrile-based compound both of which are a generally used as a heat polymerization initiator. However, any image recording sensitivity thereof is 200 $mJ/cm^2$ or more, and therefore, preheat treatment in an exposure process is required in order to improve the sensitivity. As described above, in the present condition, high sensitivity practically required cannot be achieved.

Particularly, when a recording layer of heat mode polymerization system is used, it may use an initiator having a lower decomposition temperature and cause polymerization at lower energy, in order to improve the sensitivity. However, when an initiator having lower decomposition temperature is simply and randomly selected as the initiator, problems such as generation of pollutions in non-image portions may occur, since stability thereof may decrease.

SUMMARY OF THE INVENTION

A first object of the present invention is to provide a heat sensitive composition which can cause irreversible change by heating in physical properties with high sensitivity, and a negative planographic printing plate precursor comprising the composition, which precursor can be recorded with high sensitivity, and in which heating treatment before development is not necessary or heating treatment can be simplified, and which precursor can be recorded by heat mode.

The present inventors have intensively studied and resultantly found that a composition, which is excellent in hardening property and color developing property due to heating, is obtained by containing in a composition, a radical generator of the following general formula (I) and a compound in which physical properties thereof can be changed irreversibly by the action of the generated radical. Further, they found that a planographic printing plate having high sensitivity could be achieved by providing a recording layer containing such a composition.

Namely, a first aspect of the present invention is a heat sensitive composition comprising: (A-I) a compound which is represented by the following general formula (I), and generates a radical by heat, and (B-I) a compound having at least one of physical and chemical properties, which are changed irreversibly by a radical;

$$R—SO_2^-M^+ \qquad \text{general formula (I)}$$

wherein R represents one of an alkyl group and aryl group, and $M^+$ represents a counter cation selected from sulfonium, iodonium, diazonium, ammonium and azinium.

By further adding (C-I) a light-heat converting agent to the composition, recording by exposure such as heat mode exposure becomes possible as follows. When the composition is exposed to a light in a range of the absorption wavelength of the light-heat converting agent (C-I), a radical of (A-I) the compound generating a radical by heating of the general formula (I) is generated due to heat caused by (C-I) the light-heat converting agent. Further, due to the radical, the physical or chemical properties of (B-I) the compound having physical or chemical properties changing irreversibly by a radial change are changed. The heat sensitive composition of the present invention is characterized in that it causes irreversible change in properties by heat, and by adding a light-heat converting agent to the composition, the above-mentioned change in properties can be caused by heat mode exposure, typically by laser generating infrared ray. Namely, a composition having a photosensitivity can be obtained. Therefore, a planographic printing plate precursor of a tsecond aspect of the invention, which comprises the composition further containing (C-I) the light-heat converting agent, can be recorded by heat mode exposure, due to (C-I) a light-heat converting agent.

That is, the second aspect of the present invention is a heat mode compatible planographic printing plate precursor comprising a substrate having disposed thereon a recording layer containing (A-I) a radical polymerization initiator of the above general formula (I), (C-I) a light-heat converting agent, (B-II) a compound having a polymerizable unsaturated group, and (D) a binder polymer.

A third object of the present invention is to obtain a planographic printing plate precursor which can be recorded directly from digital data of computers and the like, requires no heating treatment after image-wise exposure, and shows excellent sensitivity in recording, by conducting recording using solid laser and semiconductor laser emitting infrared ray.

The present inventors have noticed constituent components of a negative image recording material and studied intensively, and resultantly found that high sensitivity in recording can be achieved by using an onium salt of a mother nucleus having a divalent cation structure as a polymerization initiator, leading to completion of the first aspect of the present invention.

Namely, the third aspect of the instant application is a heat mode compatible planographic printing plate precursor comprising a substrate having thereon a photosensitive layer which is recordable by heat mode laser, wherein the photosensitive layer contains (A-II) an onium salt having at least two cation parts in one molecule, (B-II) a compound having a polymerizable unsaturated group, and (C-II) a light-heat converting agent.

It is preferable that this photosensitive layer further contains (D) a binder for the purpose of improving film property and the like.

Though the function or action of the third aspect of the present invention is not clear, it is supposed that since an onium salt having two or more cation parts in one molecule is contained as a light or heat polymerization initiator, by adopting a mother nucleus having di- or more valent cation structure, electron density on the onium salt decreases, thermal decomposition is easily promoted, high sensitivity is achieved.

Further, because of the presence of di- or more valent cation parts of the onium salt, when a radical is generated at a site connecting cation parts, a function as a cross-linking agent is also manifested, and further high sensitivity and improvement in printing resistance by a formation of a cross-linked structure can also be achieved.

Further, by using the onium salt as a light-heat converting agent in combination with coloring materials such as a cyanine coloring material having a charge, the coloring materials and onium salt tend to ionically localized in a photosensitive layer, and by localization of the light-heat converting agent and onium salt, the decomposition of the onium salt by heat generated from the light-heat converting agent is conducted efficiently, and further high sensitivity can be realized.

In the present invention, "heat mode compatible" or "heat mode correspondence" means that recording by heat mode exposure is possible. The definition of heat mode exposure in the present invention is described in detail below. As described in Hans-Joachim Timpe, IS & Ts NIP 15: 1999 International Conference on Digital Printing technologies. P. 209, it is known that largely two modes are present for a process of from light excitation of a light absorbing substance to chemical or physical change, the process comprising light-excitation of a light absorbing substance (e.g., coloring material) in a photosensitive material, to form an image through chemical or physical change. One is a so-called photon mode in which a light-excited light absorbing substance is deactivated by some photochemical interaction (for example, energy transfer, electron transfer) with a reactive substance in a photosensitive material, and the resultantly activated reactive substance causes chemical or physical change necessary for the above-mentioned image formation, and another is a so-called heat mode in which a light-excited light absorbing substance generates heat to be deactivated, and a reactive substance causes chemical or physical change necessary for the above-mentioned image formation, by utilizing the heat. Additionally, there are also special modes such as ablation in which substances are explosively scattered by energy of light locally gathered, multiple photon absorption in which one molecule absorbs a lot of photons simultaneously, and the like, however, these modes are abbreviated here.

Exposure processes utilizing the above-mentioned respective modes are called photon mode exposure and heat mode exposure, respectively. The technological difference between the photon mode exposure and the heat mode exposure is that the sum of energy quantity of several photons exposed can be used or not, for the energy quantity in the intended reaction. For example, it is hypothesized to use n photons, to cause a certain reaction. In the photon mode exposure, since a photochemical interaction is utilized, it is impossible to sum energy of photons and uses it in accordance with requirements of quantum energy and a law of conservation of momentum. Namely, for causing some reaction, a relation of "energy quantity of one photon$\geqq$energy quantity of reaction" is necessary. On the other hand, in the heat mode exposure, since light energy is converted into heat and utilized so that the heat is generated after light excitation, it is possible to sum energy quantity of photons together. Therefore, a relation of "energy quantity of n photons$\geqq$energy quantity of reaction" is sufficient. However, this energy quantity addition is restricted by thermal diffusion. Namely, if, until escaping of heat by thermal diffusion from an exposed portion (reaction point) now noticed, next light excitation-deactivation process occurs and heat is generated, then heat is securely accumulated and added, leading to increase in temperature in this portion. However, if the next heat generation is delayed, heat escapes and is not accumulated. That is, in the heat mode exposure, there exists a difference in results between the case of irradiation with light of high energy quantity for short period of time and the case of irradiation with light of low energy quantity for long period of time, even at the same total exposure energy quantity, and the case of short period of time is advantageous for accumulation of heat.

Of course, in the photon mode exposure, resemble phenomena may occur in some cases due to an influence of diffusion of the subsequent reaction species, however, such cases dot not occur basically.

Namely, from the standpoint of the properties of a photosensitive material, in the photon mode, the intrinsic sensitivity (energy amount for reaction which is necessary for image formation) of a photosensitive material is constant against the exposure power density (w/cm$^2$) (=energy density per unit time), however, in the heat mode, the intrinsic sensitivity of a photosensitive material increases against the exposure power density. Therefore, if exposure time which is approximately capable of maintaining productivity which is practically necessary as an image recording material is fixed, when respective modes are compared, in the photon mode exposure, high sensitivity of about 0.1 mJ/cm$^2$ is usually achieved, however, since a reaction occurs at any small exposure amount, a problem of low exposure fogging easily occurs at non-exposure portions. On the other hand, in the heat mode exposure, a reaction occurs only at certain level exposure amount or more, and approximately 50 mJ/cm$^2$ is usually necessary due to the relation with heat stability of a photosensitive material, however, the problem of low exposure fogging is avoided.

Thus, in the heat mode exposure, actually, the exposure powder density on the plate surface of a photosensitive material is required to be 5000 w/cm$^2$ or more, preferably 10,000 w/cm$^2$ or more. Though not described in detail here, when high powder density laser of 5.0×10$^5$ w/cm$^2$ or more is utilized, ablation occurs, a light source is polluted, and other problems occur, undesirably.

DESCRIPTION OF THE PREFERRED EMBODIMENTS

[Heat Sensitive Composition]

The first embodiment of the heat sensitive composition of the present invention contains (A-I) a radical generator of the general formula (I) and a (B-I) a compound having physical and/or chemical properties changing irreversibly by a radial. Therefore, the radical generator (A-I) represented by the general formula (I) is decomposed by being heated to generate a radical, and the physical and/or chemical properties of the compound (B-I) change by an action of the above-mentioned radical, leading to generation of a hardening reaction by radical polymerization, color development, decoloring reaction and/or the like. Moreover, by further inclusion of (C-I) a light-heat converting agent into this heat sensitive composition, when irradiated with light having absorption wavelength of this light-heat converting agent, for example, infrared laser or the like, the light-heat converting agent (C-I) generates heat, and the radical generator (A-I) of the general formula (I) is decomposed to generate a radical by heat of infrared laser light itself, or by heat generated by the light-heat converting agent (C-I), and the compound (B-I) having physical or chemical properties changing irreversibly by a radial shows change in properties.

Though the action of the present invention is not definite, the radical generator (A-I) of the general formula (I) contained in the heat sensitive composition of the present invention is a compound having an onium salt structure carrying sulfinic acid as a counter anion, and the physical properties of the compound (B-I), which has physical or chemical properties changing irreversibly by the radical, can be changed with high sensitivity due to the radical generator (A-I), as compared with compounds having sulfonate (—$SO_3$−), inorganic salts ($PF_6^-$, $SbF_6^-$, $BF_6^-$) as a counter anion, which are used generally as a radical polymerization initiator. As the cause of this high sensitivity, it is supposed that, because of high reactivity of sulfinic acid as compared with sulfonic acid or inorganic salts, when heat is applied, reaction can occur at high efficiency with an onium mother nucleus, and radical species are generated in large amount.

(Compound (A-I) Generating Radical by Heating of the General Formula (I))

The radical generator used in the present invention is represented by the following general formula (I).

$$R—SO_2^-M^+ \qquad \text{General formula (I)}$$

In the above formula, R represents preferably an alkyl group having 1 to 20 carbon atoms or an aryl group having 1 to 20 carbon atoms. R may have a ring structure. Further, these alkyl group or aryl group may have a substituent, and specific examples of the substituent which can be introduced includes alkyl groups, alkoxy groups, alkenyl groups, alkynyl groups, amino groups, cyano groups, hydroxyl group, halogen atoms, amide groups, ester groups, carbonyl groups, carboxyl groups and the like, these may further have substituents as described above. Further, two or more substituents may be connected to each other to form a ring, and the ring structure may also be a heterocyclic ring structure containing at least one nitrogen atom, sulfur atom and the like. Among them, R is preferably an aryl group from the standpoints of stability and synthesis suitability.

M$^+$ represents a counter cation selected from sulfonium, iodonium, diazonium, ammonium and azinium.

Here, the azinium has an azine ring which is a 6-membered ring containing a nitrogen atom in the structure, and includes pyridinium, diazinium and triazinium. The azinium contains one or more aromatic rings condensed with an azine ring, for example, includes quinolinium, isoquinolinium, benzoazinium, naphthoazinium and the like. Specific examples include those described in U.S. Pat. No. 4,743,528, JP-A Nos. 63-138345, 63-142345, 63-142346, and JP-B No. 46-42363, such as counter anions forming 1-methoxy-4-phenylpyridinium tetrafluoroborate, N-alkoxypyridinium salts.

Among these counter anions, compounds having iodonium or sulfonium as a counter cation are preferable from the standpoints of stability and sensitivity, further, compound having a diaryl iodonium or triaryl sulfonium skeleton structure is preferable.

Specific examples of the polymerization initiator of the general formula (I) are shown below in the form of a combination with a cation part corresponding to a preferable counter cation, however, the scope of the present invention is not limited to these examples.

As the preferable structure of an iodonium skeleton, a diarylsulfonium skeleton structure is preferable from the standpoint of stability, and an aryl group may be substituted like the above-mentioned aryl group. Preferable iodonium salt (having iodonium as counter cation) compounds are first exemplified below [exemplary compound (IA-1) to exemplary compound (IJ-5)].

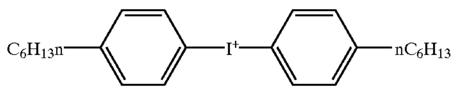

(IA-1)

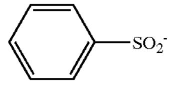

(IA-2)

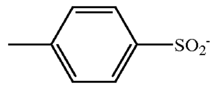

(IA-3)

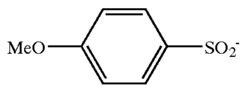

-continued
(IA-4)
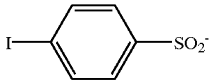
(IA-5)
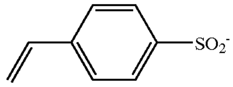
(IA-6)
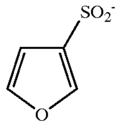
(IA-7)
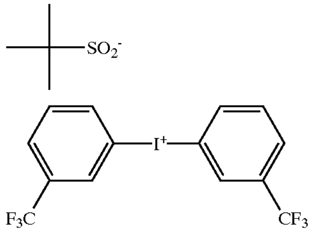
(IB-1)
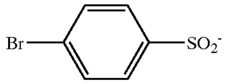
(IB-2)
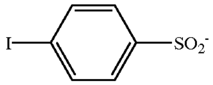
(IB-3)
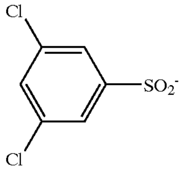
(IB-4)
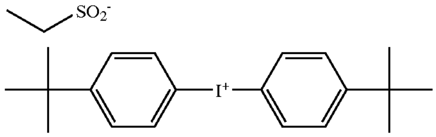
(IC-1)
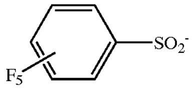
(IC-2)
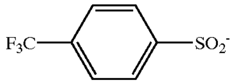
(IC-3)
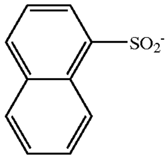
(IC-4)
$CH_3SO_2^-$
(IC-5)
$CF_3SO_2^-$
-continued
(IC-6)
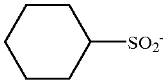
(IC-7)
$CCl_3SO_2^-$
(IC-8)
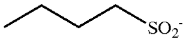
(IC-9)
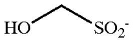
(IC-10)
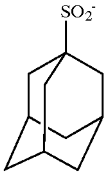
(IC-11)
$C_{15}H_{31}SO_2^-$
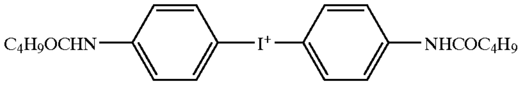
(ID-1)
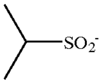
(ID-2)
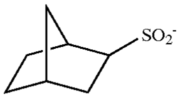
(ID-3)
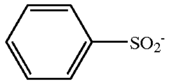
(ID-4)
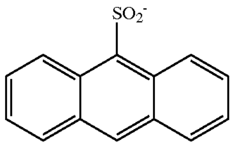
(ID-5)
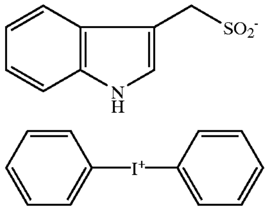
(IE-1)
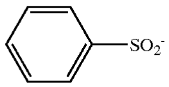
(IE-2)
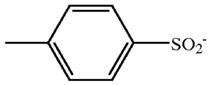
(IE-3)
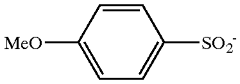

-continued
(IE-4)
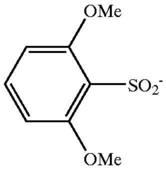
(IE-5)
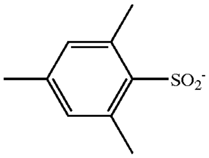
(IE-6)
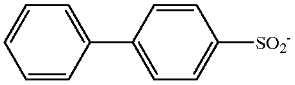
(IE-7)
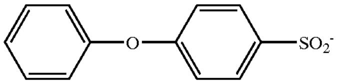
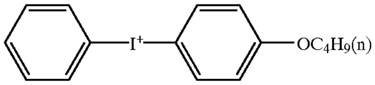
(IF-1)
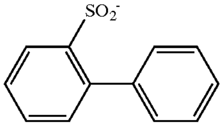
(IF-2)
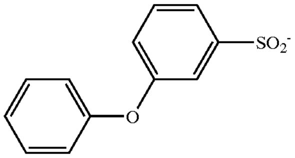
(IF-3)
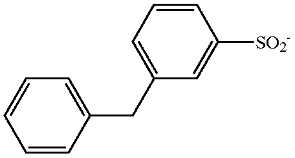
(IF-4)
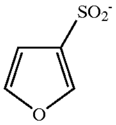
(IF-5)
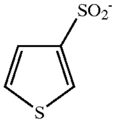
(IF-6)
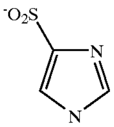
-continued
(IF-7)
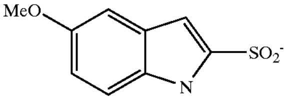
(IF-8)
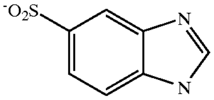
(IF-9)
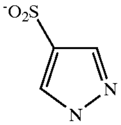
(IF-10)
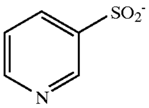
(IF-11)
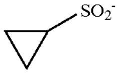
(IF-12)
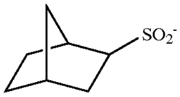
(IF-13)
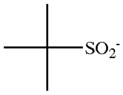
(IF-14)
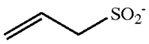
(IF-15)
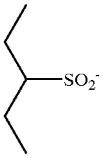
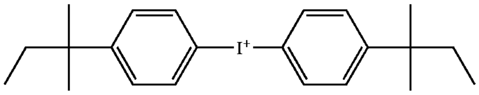
(IG-1)
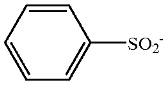
(IG-2)
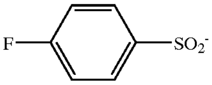
(IG-3)
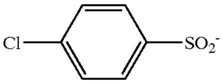
(IG-4)
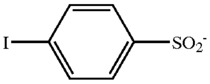
(IG-5)
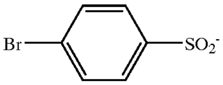

-continued
(IG-6)
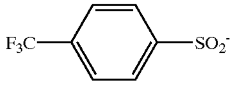
(IG-7)
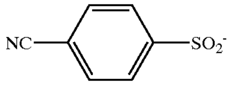
(IG-8)
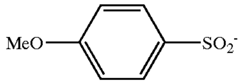
(IG-9)
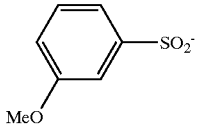
(IG-10)
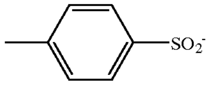
(IG-11)
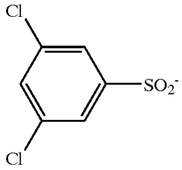
(IG-12)
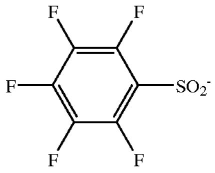
(IG-13)
$CF_3SO_2^-$
(IG-14)
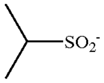
(IG-15)
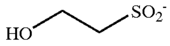
(IG-16)
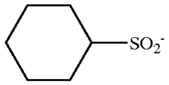
(IG-17)
$CCl_3SO_2^-$
(IG-18)
n-$C_8F_{17}SO_2^-$
(IG-19)
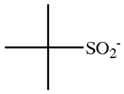
(IG-20)
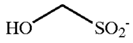
(IG-21)
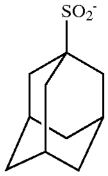
-continued
(IG-22)
$C_{12}H_{25}SO_2^-$
(IG-23)
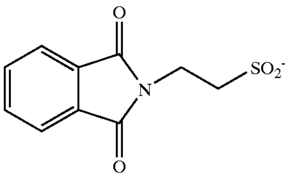
(IG-24)
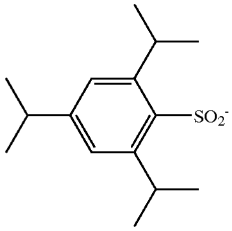
(IG-26)
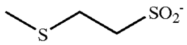
(IG-27)
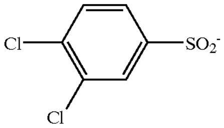
(IG-28)
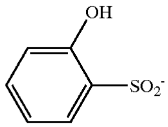
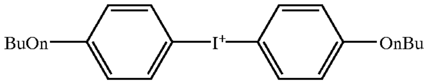
(IH-1)
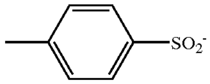
(IH-2)
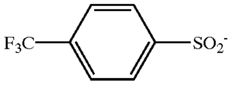
(IH-3)
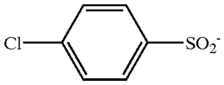
(IH-4)
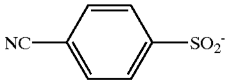
(IH-5)
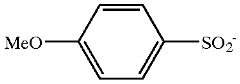
(IH-6)
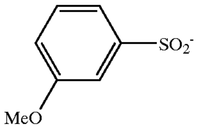

-continued (IH-7)

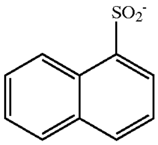

(IH-8)

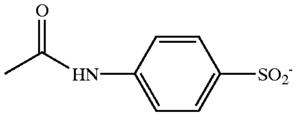

(IH-9)

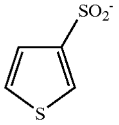

(IH-10)

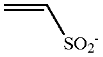

(IH-11)

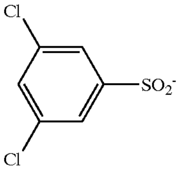

(IH-12)

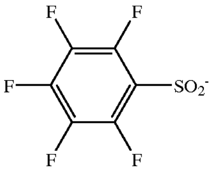

(IH-13)

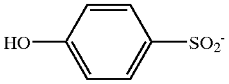

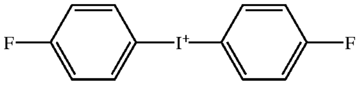

(IJ-1)

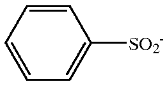

(IJ-2)

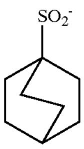

(IJ-3)

$CF_3CF_2CF_2CF_2SO_2^-$ (IJ-4)

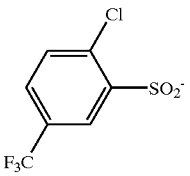

-continued (IJ-5)

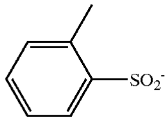

(IJ-3)

$CF_3CF_2CF_2CF_2SO_2^-$ (IJ-4)

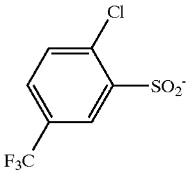

(IJ-5)

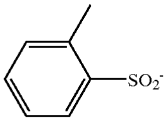

As the preferable structure of a sulfonium skeleton, a triarylsulfonium skeleton structure is preferable from the standpoints of sensitivity and stability, and an aryl group may be substituted like the above-mentioned aryl group. Next, preferable sulfonium salt (having sulfonium as counter cation) compounds are exemplified [exemplary compounds (SA-1) to (SH-2)].

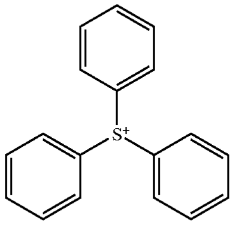

(SA-1)

$CH_3SO_2^-$ (SA-2)

$CF_3SO_2^-$ (SA-3)

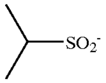

(SA-4)

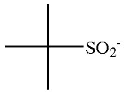

(SA-5)

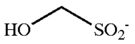

(SA-6)

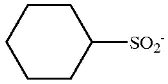

(SA-7)

$C_8F_{17}SO_2^-$ (SA-8)

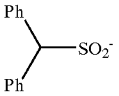

(SA-9)

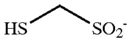

-continued
(SA-10)
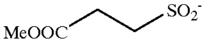
(SA-11)
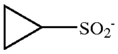
(SA-12)
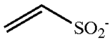
(SA-13)
$CH_3(CH_2)_{17}CH_2SO_2^-$
(SA-14)
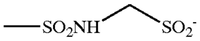
(SA-15)
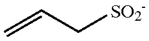
(SA-16)
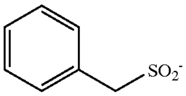
(SA-17)
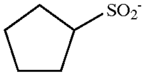
(SA-18)
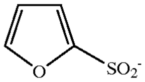
(SA-19)
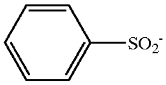
(SA-20)
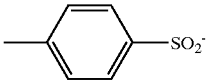
(SA-21)
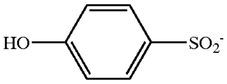
(SA-22)
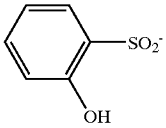
(SA-23)
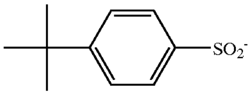
(SA-24)
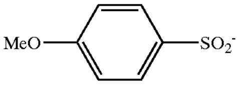
(SA-25)
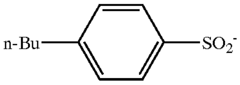
(SA-26)
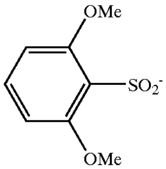
-continued
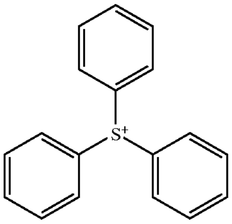
(SA-27)
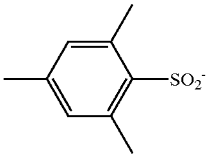
(SA-28)
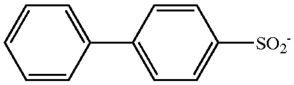
(SA-29)
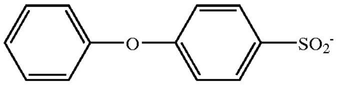
(SA-30)
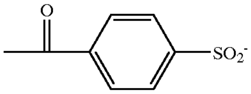
(SA-31)
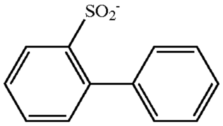
(SA-32)
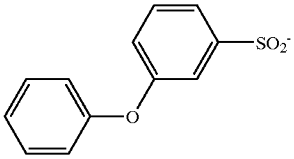
(SA-33)
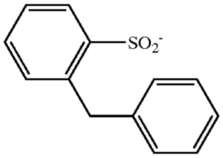
(SA-34)
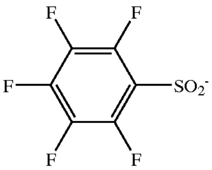
(SA-35)
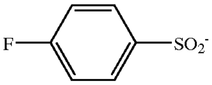
(SA-36)
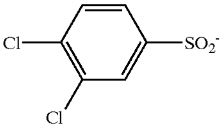

-continued
(SA-37)
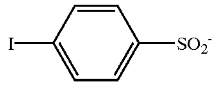
(SA-38)
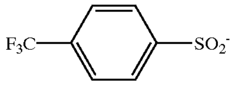
(SA-39)
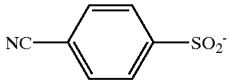
(SA-40)
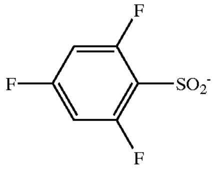
(SA-41)
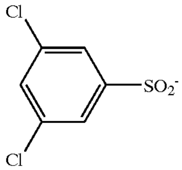
(SA-42)
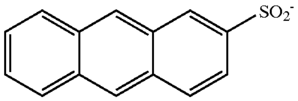
(SA-43)
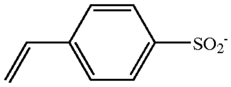
(SA-44)
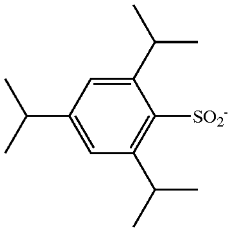
(SA-45)
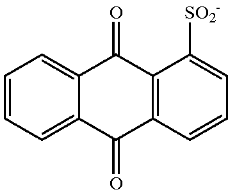
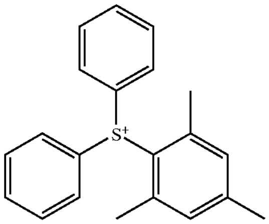
-continued
(SB-1)
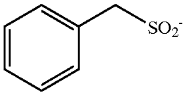
(SB-2)
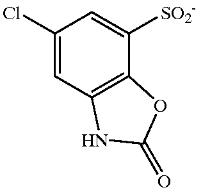
(SB-3)
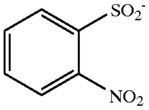
(SB-4)
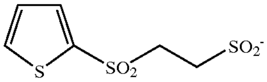
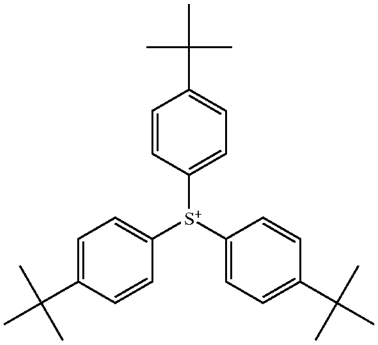
(SC-1)
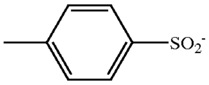
(SC-2)
$CF_3SO_2^-$
(SC-3)
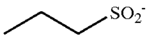
(SC-4)
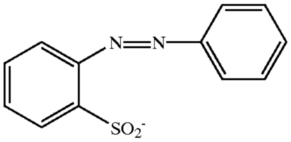
(SC-5)
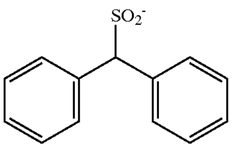
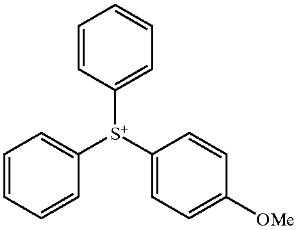

-continued (SD-1)

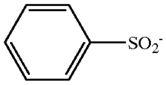

(SD-2)

$CF_3SO_2^-$ (SD-3)

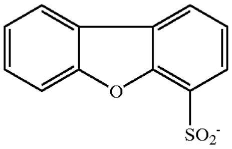

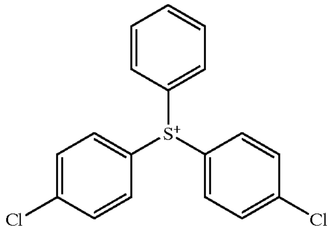

(SE-1)

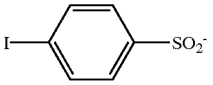

(SE-2)

$CH_3SO_2^-$ (SE-3)

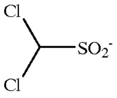

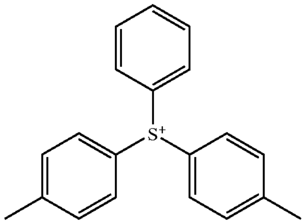

(SF-1)

$n\text{-}C_7H_{15}SO_2^-$ (SF-2)

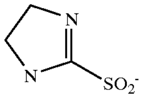

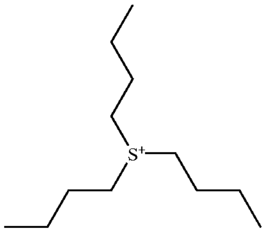

(SG-1)

$n\text{-}C_4H_9SO_2^-$ (SG-2)

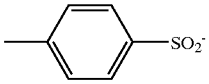

-continued

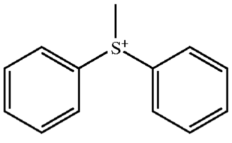

(SH-1)

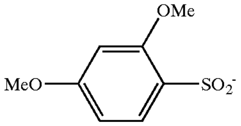

(SH-2)

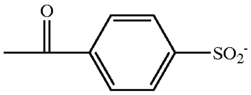

As the typical example, a synthesis example of an exemplary compound (SA-20) will be shown below.

50.9 g of diphenyl sulfoxide was dissolved in 800 ml of benzene, and to this was added 200 g of aluminum chloride, and the mixture was refluxed for 24 hours. The reaction solution was poured slowly into 2 L of water under ice cooling, and to this was added 400 ml of concentrated hydrochloric acid, and the mixture was heated at 70° C. for 10 minutes. This aqueous solution was washed with 500 ml of ethyl acetate and filtrated, then, to this was added a solution prepared by dissolving 200 g of ammonium iodide in 400 ml of water.

The precipitated powder was filtrated, washed with water, then, washed with ethyl acetate, and dried, to give 70 g of triphenylsulfonium iodide.

7.8 g of triphenylsulfonium iodide was dissolved in 100 ml of methanol, to this solution was added 4.98 g of silver oxide, and the mixture was stirred for 4 hours at room temperature. The solution was filtrated, to this was added excess amount of sodium p-toluenesulfinate, and further, 2 ml of concentrated hydrochloric acid was added. The reaction solution was concentrated, and the concentrated solution was washed with ethyl acetate and hexane, and vacuum-dried to give viscous oil. This was dissolved in chloroform, filtrated and concentrated, and this process was repeated twice, to obtain SA-20 in the form of viscous oil.

Other sulfonium salt and iodonium salt can also be synthesized by appropriately selecting starting substances and sulfinic acid added.

As the other method of obtaining iodonium iodide, methods described in Bull. Chem. Soc. Jpn. 70, 219–224 (1997), Bull. Chem. Soc. Jpn. 70, 1665–1669 (1997), Bull. Chem. Soc. Jpn. 70, 115–120 (1999), J. Amer. Chem. Soc; 82; 1960, 725–731, J. Amer. Chem. Soc; 81; 1959, 342–246, and the like, can be used.

As the other method of obtaining sulfonium iodide, methods described in J. Amer. Chem. Soc; 91; 1969, 145–150, and the like, can be used.

In the heat sensitive composition of the present invention, the above-mentioned radical generator of the following general formula (I) is contained in an amount of preferably from 0.5 to 20% by weight, further preferably from 1 to 15% by weight, based on the total solid components of the composition.

In the present invention, other known light polymerization initiators (having no sulfinic acid structure), heat polymerization initiators and the like can be selected and used together in amounts not deteriorating the effect of the present invention, in addition to the above-mentioned specific radical generator. As these polymerization initiators which can be used together, for example, known onium salts having no sulfinic acid structure in a counter cation part, triazine compounds having a trihalomethyl group, peroxides, azo-based polymerization initiators, azide compounds, quinoneazide and the like are listed.

As the specific examples of the onium salts which can be suitably used as the radical generator which can be used together, those described in Japanese Patent Application No. 11-310623, paragraph numbers [0030] to [0033] are listed.

Also preferably used are known polymerization initiators such as onium salts of the general formulae (I) to (IV) described in Japanese Patent Application No. 9-34110, paragraph numbers [0012] to [0050], heat polymerization initiators described in JP-A No. 8-108621, paragraph number [0016], and the like.

When other one or more polymerization initiators are used in combination with the generator, the content of them is preferably 50% by weight or less, based on the above-mentioned specific radical generator represented by the general formula (I).

The radical generator used in the present invention has a maximum absorption wavelength of preferably 400 nm or less, further preferably 360 nm or less. By thus controlling the absorption wavelength in an ultraviolet region, handling of an image formation material can be effected under a white light.

<Compound (B-I) Having Physical and/or Chemical Properties Changing Irreversibly by Radical>

The compound (B-I) having physical and/or chemical properties changing irreversibly by a radical, the compound being a second essential component in a heat sensitive composition according to the first embodiment of the present invention, will be described below. This compound is a compound which has physical properties and/or chemical properties which are changed by the action of a radical generated from the above-mentioned radical generator by heat, and the changed conditions is kept. The compound (B-I) is not particularly restricted, and any compounds can be used, in so far as the compound is a compound having such properties. For example, the compounds they listed for the above-mentioned radical generator (A-I) tend to have such properties in many cases. As the properties of the compound (B-I) changing by a radical generated from a radical generator, for example, properties based on molecule thereof such as absorption spectrum (color), chemical structure, polarizability and the like, and physical properties based on material thereof such as solubility, strength, refractive index, flowability, viscous property and the like, are listed.

When a compound showing an absorption spectrum change by oxidation, reduction and/or nucleophilic addition reaction is used as the compound (B-I) oxidation, reduction and the like are caused by a radical generated from a radical generator, and image formation is possible. Such examples are disclosed, for example, in J. Am. Chem. Soc., 108, 128 (1986), J. Imaging. Soc., 30, 215 (1986), Israel. J. Chem., 25, 264 (1986).

Further, by using an addition-polymerizable or polycondensable compound as the compound (B-I) and by combining it with a radical generator (A-I), a thermosetting resin or negative photopolymer can be formed.

As the content of the compound (B-I), the optimum amount is appropriately selected depending on the intended property change or compounds used. In general, when a compound having absorption spectrum which change by oxidation, reduction and/or nucleophilic addition reaction is used, the content thereof is about 10 to 80% by weight based on the total solid components in the composition, and when an addition-polymerizable or polycondensable compound is used, the content is about 10 to 90% by weight based on the total solid components in the composition. This content is preferably in the range from 20 to 80% by weight, further preferably in the range from 30 to 70% by weight.

[Planographic Printing Plate Precursor Using Composition of First Embodiment]

Next, the planographic printing plate precursor of the present invention using the above-mentioned heat sensitive composition of the first embodiment will be described.

(Recording Layer)

First, the recording layer having an image formation ability in the planographic printing plate precursor of the present invention using the composition of the first embodiment will be described. The recording layer in the planographic printing plate precursor of the present invention contains (A-I) a radical polymerization initiator of the general formula (I), (C-I) a light-heat converting agent, (B-II) a compound having a polymerizable unsaturated group, and (D) a binder polymer. The light-heat converting agent (C-I) generates heat by irradiation with infrared laser, and the radical generator (A-I) of the general formula (I) is decomposed to generate a radical by the action of light of infrared laser or heat generated by the light-heat converting agent (C-I), consequently, a hardening reaction of the compound (B-II) having a polymerizable unsaturated group is promoted, and exposed portions are hardened, to form negative images which are image portions.

In forming a recording layer in a planographic printing plate precursor of the present invention, the radical generator of the above-mentioned general formula (I) is contained in an amount preferably of 0.5 to 20% by weight based on the total solid components constituting the recording layer. This radical generator is used in combination with a light-heat converting agent (C-I) described below, and has a function to generate a radical by the action of light or heat or both of them in irradiation with infrared laser, to initiate and promote the polymerization of a compound (B-II) having at least one polymerizable unsaturated group.

As the compound (B-II) having a polymerizable unsaturated group used in a recording layer in a planographic printing plate precursor, compounds described in detail in the explanation of the above-mentioned compound (B-I) can be used. That is, compound (B-I) can be used as the compound (B-II). (Details of the compound (B-II) are also described later as those of the third aspect of the present invention.) It may be also possible to select a compound having a specific structure as the compound (B-I) for the purpose of improving close adherence with a substrate, over coat layer and the like described below, in addition to the above-mentioned requirements. Regarding the compounding ratio of the addition-polymerizable compound (B-II) in a heat sensitive composition, larger is more advantageous for sensitivity, however, when too large, unpreferable phase separation can occur, problems on production steps due to adhesion or tackiness of a heat sensitive composition (for example, production failures derived from transfer and adhesion of sensitive components) can occur, and in the case of a planographic printing plate precursor, precipitation due to developing liquid can occur, and the like. From these viewpoints, the preferable compounding ratio is from 5 to 80% by weight, preferably from 25 to 75% by weight based on the total solid components of the composition of the recording layer, in many cases. Further, these may be used alone or in combination of two or more. Additionally, regarding the use of an addition-polymerizable compound, suitable structure, formulation, blending ratio and addition amount thereof can be optionally selected from the standpoints of an extent of polymerization inhibition with respect to oxygen, resolution, fogging property, refractive index change, surface stickiness and the like. Further in some cases, layer constitutions and application methods such as undercoat and overcoat can also be effected.

When the above-mentioned heat sensitive composition of the present invention is used as the recording layer in a planographic printing plate precursor, the above-mentioned light-heat converting agent (C) may be added into the same layer as for other components in a heat sensitive composition used for the recording layer, alternatively, a layer other than the recording layer can be provided to which the light-heat converting agent (C) is added.

When a recording layer (heat sensitive layer) in a negative planographic printing plate precursor is provided (film making), the optical density thereof at the absorption maximum in the wavelength range from 760 nm to 1200 nm is preferably between 0.1 to 3.0. Out of this range, sensitivity tends to lower. Since the optical density is determined by the addition amount of the above-mentioned light-heat converting agent (C) and the thickness of the recording layer, therefore, preferable optical density is obtained by controlling conditions of both of them. As the measuring method, for example, a method in which, on a transparent or white substrate, a recording layer is formed having a thickness appropriately determined in a range of application amount after drying which is necessary as a planographic printing plate, and the optical density is measured by an optical densitometer of transmission type, a method in which a recording layer is formed on a reflective substrate such as aluminum and the like, and the reflected density is measured, and other general methods are listed.

Components used in a photosensitive layer of a planographic printing plate precursor of the third aspect of the present invention are described below.

[Onium Salt Having Two or More Cation Parts in One Molecule (A-II)]

As a characteristic component in a photosensitive layer of a planographic printing plate precursor of the third aspect of the present invention, (A-II) an onium salt having two or more cation parts in one molecule (hereinafter, appropriately referred to as a divalent onium salt) is mentioned. In the present invention, the onium salt having two or more cation parts in one molecule indicates a compound having two or more cation parts connected by a covalent bond.

The divalent onium salt in the present invention has a function of a light or heat polymerizable initiator, namely, a function of generating a radical by light or heat energy or both energies, and initiating and promoting polymerization of a compound having a polymerizable unsaturated group.

As the onium salt having two or more cation parts used in the present invention, diazonium salts, iodonium salts, sulfonium salt, ammonium salts and phosphonium salts are listed. From the standpoint of sensitivity, diazonium salts, iodonium salts and sulfonium salts are preferable, and from the standpoint of stability, iodonium salts and sulfonium salts are further preferable.

As the iodonium salt suitably used in the present invention, di or more valent iodonium salts can be optionally selected in so far as other physical properties thereof do not cause problems. However, iodonium salts described in JP-A No. 11-153870 and J. Org. Chem 57, 6810–6814 (1992) are preferable, and from the standpoint of sensitivity, those having a structure of the following general formula (II) are most preferably listed.

General formula (II)

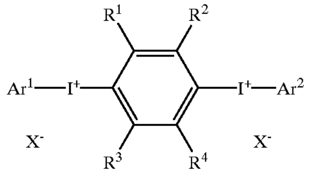

In the above general formula (II), $Ar^1$ and $Ar^2$ each represents independently an aromatic hydrocarbon having 6 to 18 carbon atoms, or a heterocyclic ring containing at least one hetero atom selected from nitrogen, oxygen and sulfur. These may have a substituent, and as the substituent, halogen atoms, alkoxy groups, cyano groups, carbonyl groups, amino groups, amide groups, sulfonyl groups, alkyl groups, aryl groups, alkenyl groups and hydroxyl group are listed. $R^1$ to $R^4$ each represent independently a hydrogen atom, halogen atom, alkoxy group, cyano group, carbonyl group, amino group, amide group, sulfonyl group, alkyl group, aryl group, alkenyl group or hydroxyl group. $X^-$ represents a monovalent anion.

As the sulfonium salt suitably used in the present invention, di or more valent sulfonium salts can be used. Sulfonium compounds described in JP-A No. 11-80118, J. Org. Chem 1992, 57, 6810–6814 are preferable, and as the most preferable examples from the standpoint of sensitivity, those of the following general formula (III) are listed.

General formula (III)

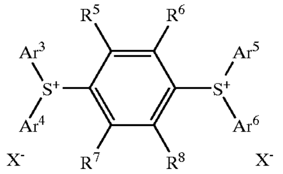

In the above general formula (III), $Ar^3$, $Ar^4$, $Ar^5$ and $Ar^6$ each represent independently an aromatic hydrocarbon having 6 to 18 carbon atoms, or a heterocyclic ring containing at least one hetero atom selected from nitrogen, oxygen and sulfur. These may have a substituent, and as the substituent, halogen atoms, alkoxy groups, cyano groups, carbonyl groups, amino groups, amide groups, sulfonyl groups, alkyl groups, aryl groups, alkenyl groups and hydroxyl group are listed. $R^5$ to $R^8$ each represent independently a hydrogen atom, halogen atom, alkoxy group, cyano group, carbonyl group, amino group, amide group, sulfonyl group, alkyl group, aryl group, alkenyl group or hydroxyl group. $X^-$ represents a monovalent anion.

The counter anion of an onium salt of the present invention can be used in so far as it is a monovalent anion. The counter anion represents preferably $PF_6^-$, $BF_4^-$, $ClO_4^-$, sulfonic acid anion, carboxylic acid anion, saccharine conjugated base or halogen anion, further preferably $PF_6^-$, $BF_4^-$, $ClO_4^-$, sulfonate anion or carboxylic acid anion from the standpoints of sensitivity and stability, most preferably a sulfonic acid anion or carboxylic acid anion. Among them, carboxylic acid anion and a sulfonic acid anion those having a $COCOO^-$ structure are preferable.

Two or more counter anions $X^-$ against a divalent onium salt of the present invention may be mutually the same or different. From the standpoint of easy production, they are preferably the same.

In the present invention, these onium salts function not as an acid generator but as a radical polymerization initiator.

The above-mentioned divalent onium salt can be synthesized by known methods. For example, the divalent onium salt can be synthesized by a method described in Chem. Mater. 1990, 2, 732–737.

A divalent iodonium salt can be synthesized by a method described in J. Org. Chem 1992, 57, 6810–6814, or J. Am. Chem. Soc. 1990, 112, 6438–6439.

As the divalent onium salt in the present invention, copolymers of iodonium salts or sulfonium salts described in JP-A No. 4-230645 can also be used.

Preferable specific examples of the divalent onium salt (A-II) suitably used in the present invention are shown below, but the scope of the present invention is not limited to them. In the following divalent onium salts, [exemplary compound (II-1) to exemplary compound (II-51)] are iodonium salt-type compounds, and [exemplary compound (S-1) to exemplary compound (S-40)] are sulfonium salt-type compounds.

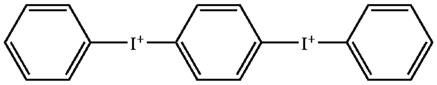

(I-1)

2 $CF_3SO_3^-$ (I-2)

2 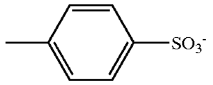

(I-3)

2 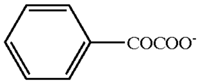

(I-4)

2 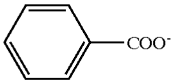

(I-5)

2 $CCl_3COO^-$ (I-6)

2 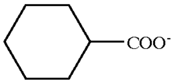

(I-7)

2 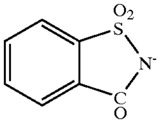

(I-8)

2 $ClO_4^-$ (I-9)

2 $BF_4^-$ (I-10)

2 $PF_6^-$

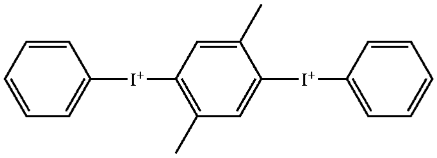

(I-11)

$PF_6^-$, $CH_3SO_3^-$ (1:1)

(I-12)

2 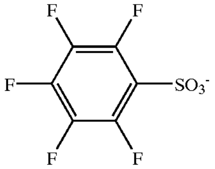

(I-13)

2 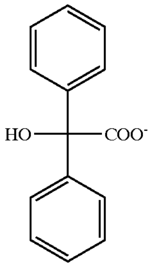

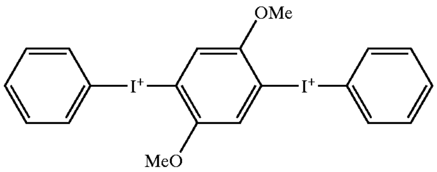

-continued
(I-14)
2 $CH_3COCOO^-$
(I-15)
2 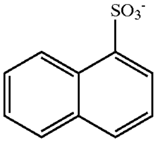
(I-16)
2 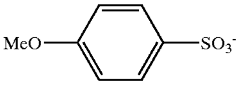
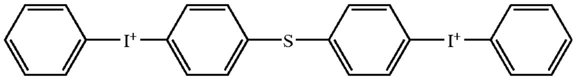
(I-17)
2 $CF_3SO_3^-$
(I-18)
2 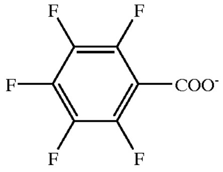
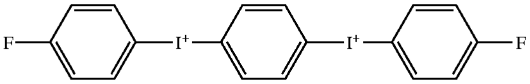
(I-19)
2 $CF_3SO_3^-$
(I-20)
2 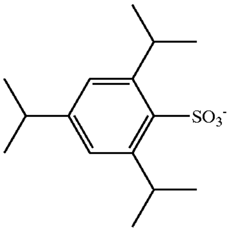
(I-21)
2 $C_{15}H_{31}COO^-$
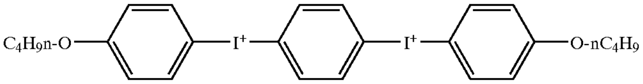
(I-22)
2 $HCOO^-$
(I-23)
2 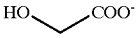
(I-24)
2 $PF_6^-$
(I-25)
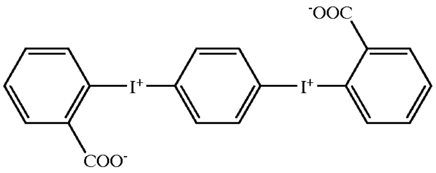
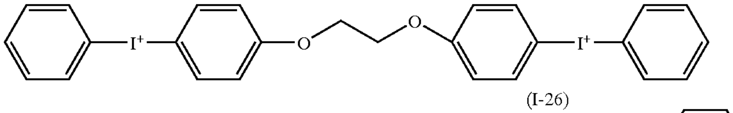
(I-26)
2 $CF_3SO_3^-$
(I-27)
2 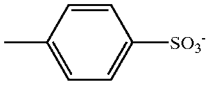
(I-28)
2 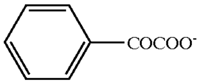
(I-29)
2 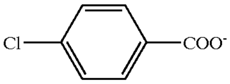
(I-30)
2 $CF_3COO^-$
(I-31)
2 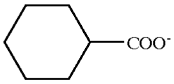
(I-32)
2 $ClO_4^-$
(I-33)
2 $n\text{-}C_4F_9SO_3^-$ -continued
(I-34)
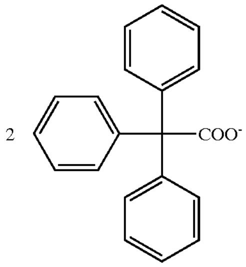
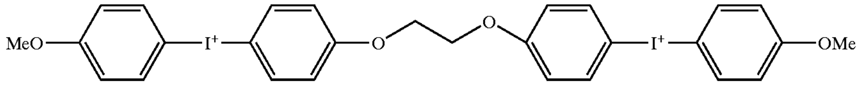
(I-35)
(I-36)
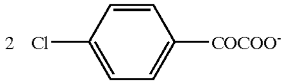
(I-37)
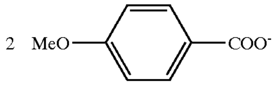
(I-38)
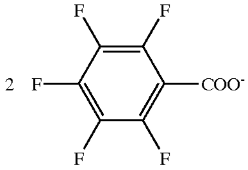
(I-39)
2 $BF_4^-$
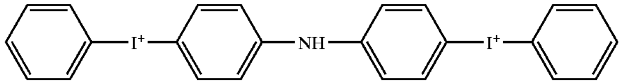
(I-40)
2 n-$C_4H_9SO_3^-$
(I-41)
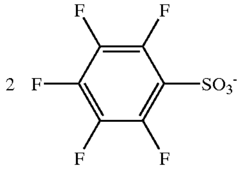
(I-42)
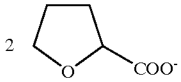
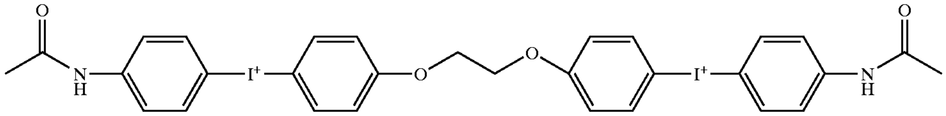
(I-43)
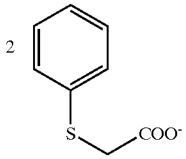
(I-44)
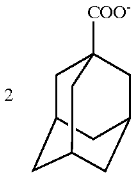
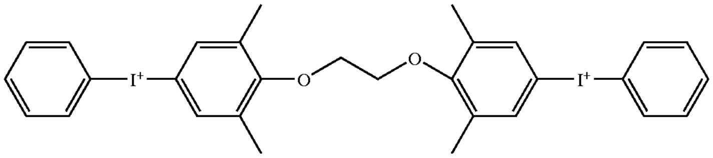

-continued
(I-45)
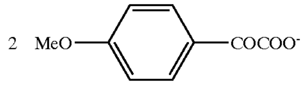
(I-46)
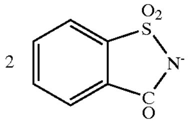
(I-47)
2 $ClO_4^-$
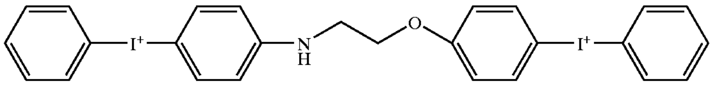
(I-48)
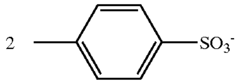
(I-49)
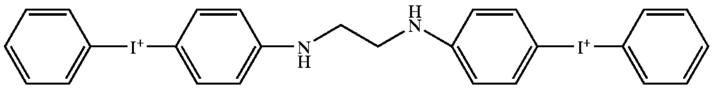
$PF_6^-$ $PF_6^-$
(I-50)
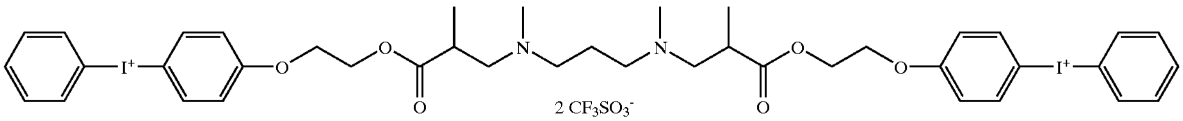
2 $CF_3SO_3^-$
(I-51)
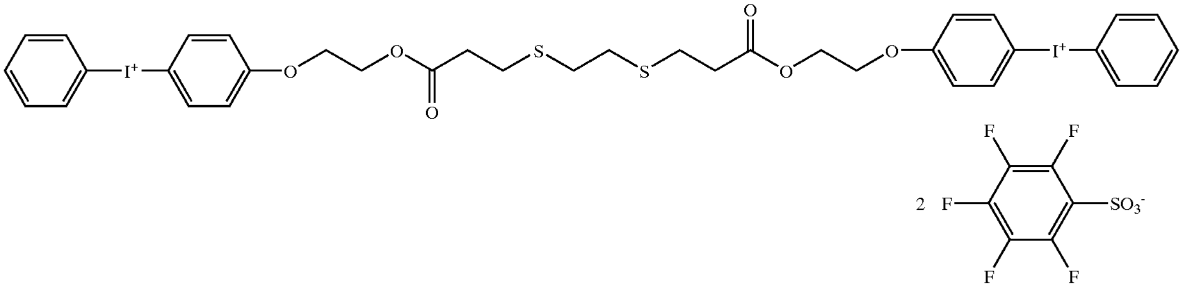
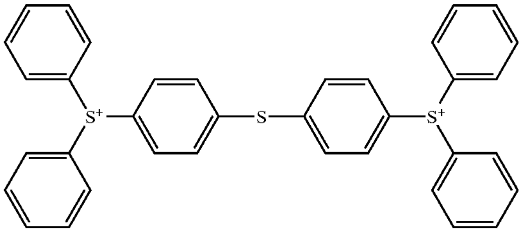
(S-1)
2 $PF_6^-$
(S-2)
(S-3)
2 $CF_3SO_3^-$
(S-4)
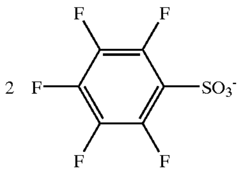
(S-5)
2 n-$C_8H_{17}SO_3^-$
(S-6)
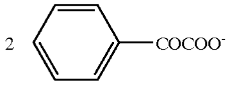
(S-7)
2 $CH_3COO^-$
(S-8)
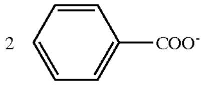

-continued
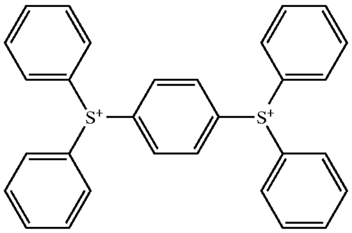
2 $CF_3SO_3^-$ (S-9)
2 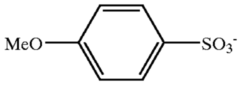 (S-10)
2 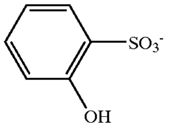 (S-11)
2 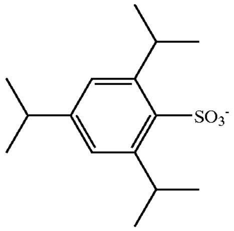 (S-12)
2 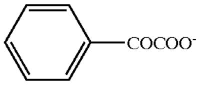 (S-13)
2 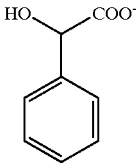 (S-14)
2 $CF_3COO^-$ (S-15)
2 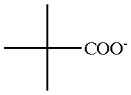 (S-16)
2$ClO_4^-$ (S-17)
2 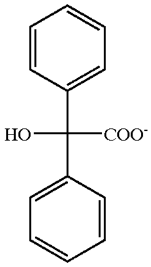 (S-18)
2 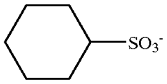 (S-19)
2 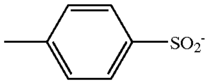 (S-20)
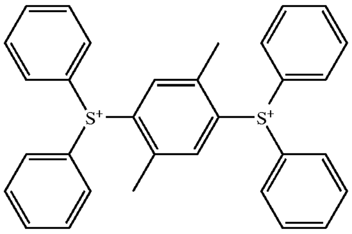
2 $SbF_6^-$ (S-21)
2 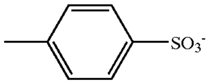 (S-22)
2 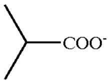 (S-23)
2 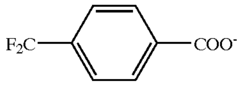 (S-24)

-continued
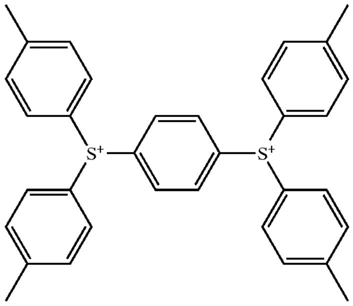
(S-25)
2 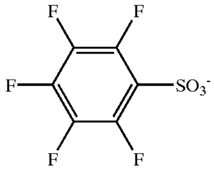
(S-26)
2 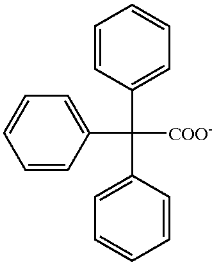
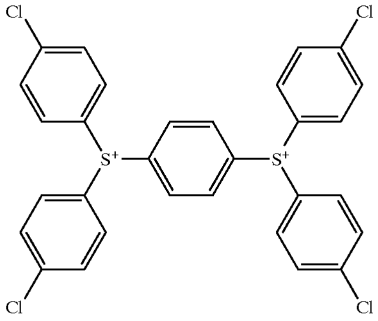
(S-27)
2 $CF_3SO_3^-$
(S-28)
2 $ClO_4^-$
(S-29)
2 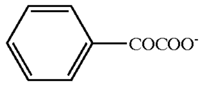
(S-30)
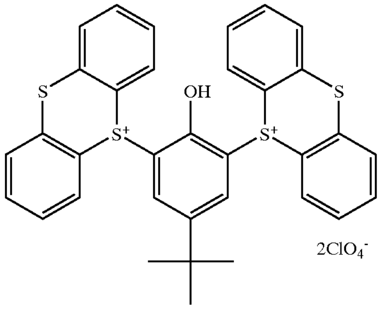
$2ClO_4^-$
(S-31)
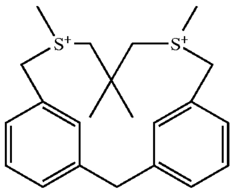
$2PF_6^-$ -continued

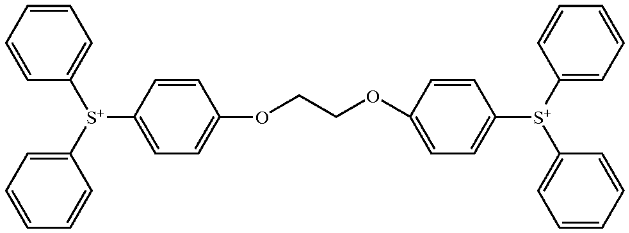

(S-32)

2 $CF_3SO_3^-$ (S-33)

2 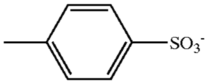

(S-34)

2 $CH_3COCOO^-$ (S-35)

2 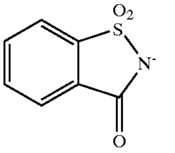

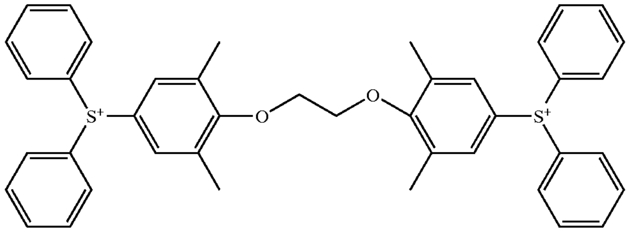

(S-36)

2 $BF_4^-$ (S-37)

2 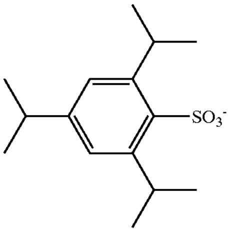

$PF_6^-$, $CF_3SO_3^-$ (1:1)

(S-38)

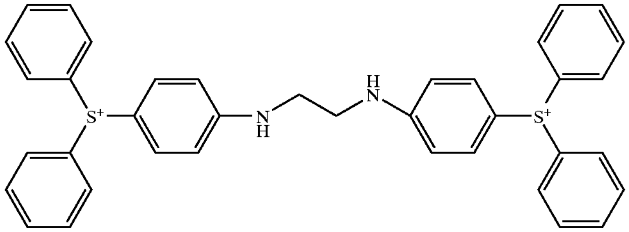

(S-39)

2 $PF_6^-$ (S-40)

2 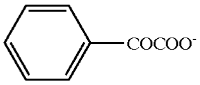

The divalent onium salts may be used alone or in combination of two or more.

The addition amount of the divalent onium salt is preferably from 1 to 45% by weight, further preferably from 3 to 40% by weight, most preferably from 5 to 30% by weight. When the addition amount is 1% or less, sensitivity is low and image formation is difficult. When 45% or more, alkali developing property lowers.

In a photosensitive layer in the present invention, known light or heat polymerization initiator such as monovalent onium salts and the like can also be used in addition to the above-mentioned divalent onium salt (A-II), in so far as it is not deteriorating the effect of the present invention.

As such a known polymerization initiator, various polymerization initiators can be used. Examples thereof include onium salts described as a polymerization initiator (II) in Japanese Patent Application No. 2000-132478, suggested previously by the present inventors, paragraph numbers [0034] to [0040], and onium salts described as an initiator in JP-A No. 9-34110, paragraph numbers [0063] to [0064].

The polymerization initiator used in the present invention has a maximum absorption wavelength of preferably 400 nm or less, further preferably 360 nm or less. By thus controlling the absorption wavelength in an ultraviolet region, handling of an image recording material can be effected under a white light.

Known polymerization initiators (other than divalent onium salt) which can be used in combination can be added in an amount of from 0 to 30% by weight based on the total solid components in a photosensitive layer. The addition amount is preferably from about 0 to 50% by weight based on the above-mentioned divalent onium salt (A-II).

Matters common to the first embodiment and the third aspect in the instant application will be described below.

[Light-Heat Converting Agent (C-I) and (C-II)]

The light-heat converting agent used in the first embodiment of the present invention has a function of absorbing the specific wavelength of light to convert it into heat. By heat generated in this process, namely, by heat mode exposure at wavelength which can be absorbed by this light-heat converting agent (C-I), a radical generator (A-I) is decomposed to generate a radical.

In the third aspect of the present invention, substances absorbing light energy irradiation beam used for recording to generate heat can be used without particular restriction of absorption wavelength region, as the light-heat converting agent used in a photosensitive layer.

The expressions (C-I) and (C-II) for the light-heat converting agent are only classified for convenience sake, and mean substantially the same compound.

The preferable light-heat converting agent used in the present invention is an infrared absorbing dye or pigment having an absorption maximum at from 760 nm to 1200 nm from the standpoint of compatibility to easily available high output laser.

As the dye, commercially available dyes and known dyes described in literatures such as, for example, "Dye Handbook (Senryo Binran)" (edited by "Organic Synthetic Chemical Institution (Yuki Gosei Kagaku Kyokai)", published in 1970) can be utilized. Specific examples thereof include azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squalirium coloring materials, pyrylium salts, metal thiolate complexes, oxonol dyes, diimmonium dyes, aminium dyes, chroconium dyes.

Examples of the preferable dyes include cyanine dyes described in JP-A Nos. 58-125246, 59-84356, 59-202829, 60-78787 and the like, methine dyes described in JP-A Nos. 58-173696, 58-181690, 58-194595 and the like, naphthoquinone dyes described in JP-A Nos. 58-112793, 58-224793, 59-48187, 59-73996, 60-52940, 60-63744 and the like, squalirium coloring materials described in JP-A No. 58-112792 and the like, cyanine dyes described in U.K. Patent No. 434,875.

Further, near infrared ray absorbing sensitizers described U.S. Pat. No. 5,156,938 are also suitably used, and substituted arylbenzo (thio) pyrylium salts described in U.S. Pat. No. 3,881,924, trimethinethiapyrylium salts described in JP-A No. 57-142645 (U.S. Pat. No. 4,327,169), pyrylium-based compounds described in JP-A Nos. 58-181051, 58-220143, 59-41363, 59-84248, 59-84249, 59-146063, 59-146061, cyanine dyes described in JP-A No. 59-216146, pentamethinethiopyrylium salts described in U.S. Pat. No. 4,283,475 and the like, and pyrylium compounds disclosed in JP-B Nos. 5-13514 and 5-19702, are also preferably used.

As other preferable examples of the dye, near infrared ray absorbing dyes described by the formulae (I) and (II) in U.S. Pat. No. 4,756,993 are listed.

Among these dyes, particularly preferable are cyanine coloring materials, phthalocyanine dyes, oxonol dyes, squalirium coloring materials, pyrylium salts, thiopyrylium dyes and nickel thiolate complexes. Further dyes of the following general formulae (a) to (e) are preferable because of excellent light-heat converting efficiency. Particularly cyanine coloring materials of the following general formula (a) are most preferable since high polymerization activity is obtained and stability and economy are also excellent when they are used in a composition constituting a photosensitive layer of the present invention.

General formula (a)

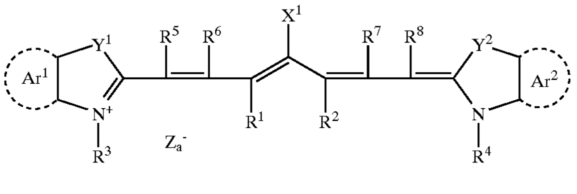

In the general formula (a), $X^1$ represents a hydrogen atom, halogen atom, $—NAr^3_2$, $X^2—L^1$ or a group shown below. Here, $Ar^3$ represents a halogen atom, alkoxy group, carbonyl group, sulfonyl group, amide group, hydroxyl group, or aromatic group optionally substituted with an alkyl group, $X^2$ represents an oxygen atom or sulfur atom, and $L^1$ represents a hydrocarbon group having 1 to 12 carbon atoms, an aromatic ring having at least one hetero atom, or a hydrocarbon group having 1 to 12 carbon atoms containing a hetero atom. Here, the hetero atom means N, S, O, halogen atom or Se.

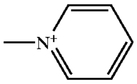

$R^1$ and $R^2$ each represents independently a hydrocarbon group having 1 to 12 carbon atoms. From the standpoint of preservation stability of photosensitive layer application liquid, $R^1$ and $R^2$ represent a hydrocarbon group having two or more carbon atoms, further, it is particularly preferable that $R^1$ and $R^2$ are connected to each other to form a 5-membered or 6-membered ring.

$Ar^1$ and $Ar^2$ may be the same or different each other and represent an aromatic hydrocarbon group optionally having a substituent. As the preferable aromatic hydrocarbon group, a benzene rind and a naphthalene ring are listed. As the preferable substituent, hydrocarbon groups having 12 or less carbon atoms, halogen atoms and alkoxy groups having 12 or less carbon atoms are listed. $Y^1$ and $Y^2$ may be the same or different each other and represent a sulfur atom or a dialkylmethylene group having 12 or less carbon atoms. $R^3$ and $R^4$ may be the same or different each other and represent a hydrocarbon group having 20 or less carbon atoms optionally having a substituent. As the preferable substituent, alkoxy groups having 12 or less carbon atoms, carboxyl group and sulfo group are listed. $R^5$, $R^6$, $R^7$ and $R^8$ may be the same or different, and represent a hydrogen atom or a hydrocarbon group having 12 or less carbon atoms. From the standpoint of availability of raw materials, a hydrogen atom is preferable. $Z_a^-$ represents a counter anion. When a sulfo group is substituted for any of $R^1$ to $R^8$, $Z_a^-$ is not necessary. $Z_a^-$ is preferably a halogen ion, perchloric acid ion, tetrafluoroborate ion, hexafluorophosphate ion or sulfonic acid ion from the standpoint of preservation stability of photosensitive layer application liquid, and particularly preferably a perchloric acid ion, hexafluorophosphate ion or arylsulfonic acid ion.

In the present invention, as the specific examples of the cyanine coloring material of the general formula (a) which can be suitably used, those described in Japanese Patent Application No. 11-310623, paragraph numbers [0017] to [0019], Japanese Patent Application No. 2000-224031, paragraph numbers [0012] to [0038] and Japanese Patent Application No. 2000-211147, paragraph numbers [0012] to [0023] are listed, in addition to those exemplified below. Among cyanine coloring materials of the general formula (a), those in which $X^1$ represents —$NAr^3_2$ are most preferable from the standpoint of sensitivity.

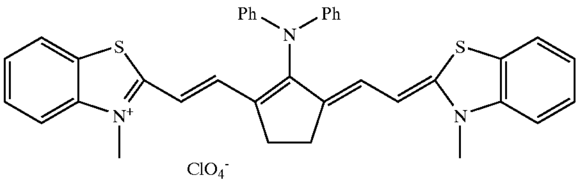

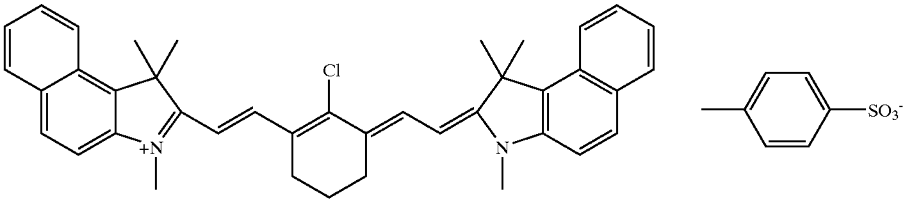

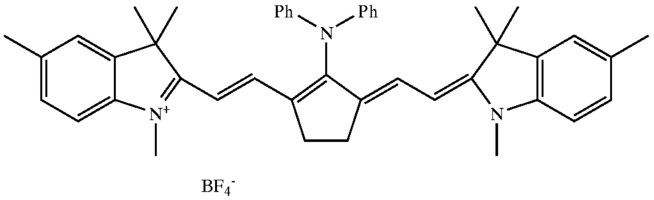

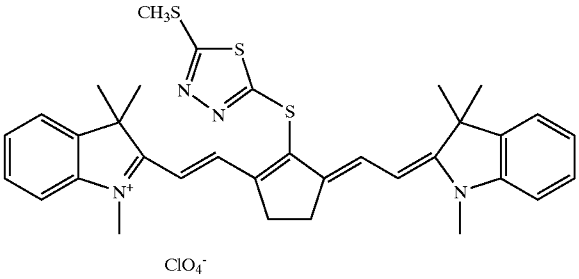

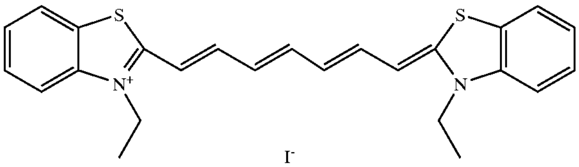

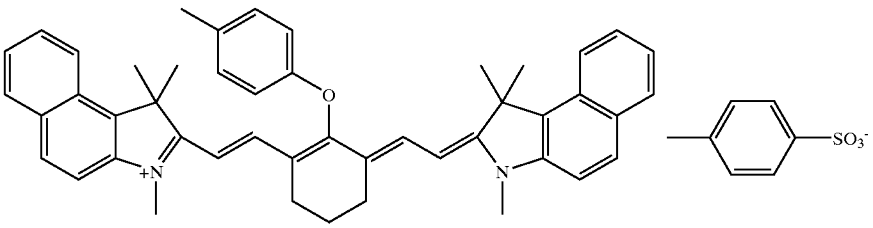

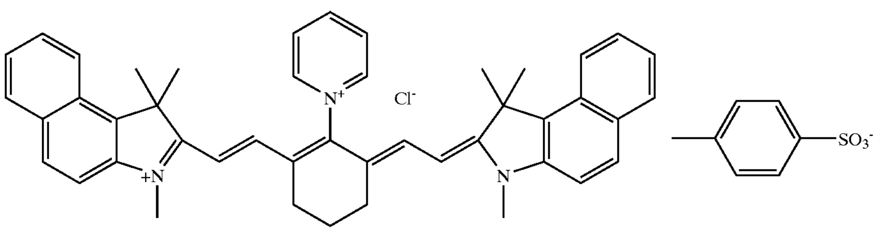

-continued
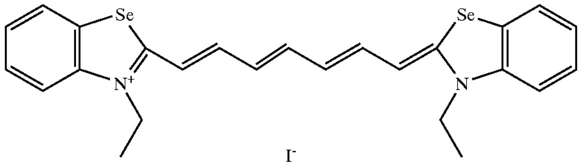
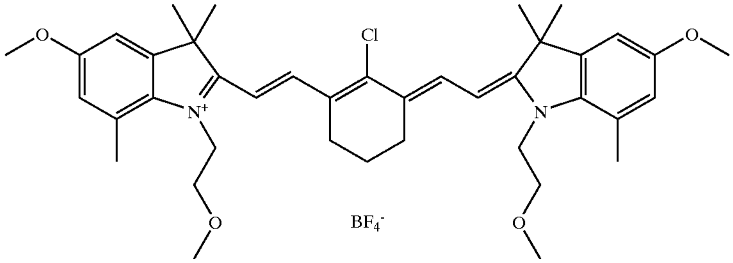
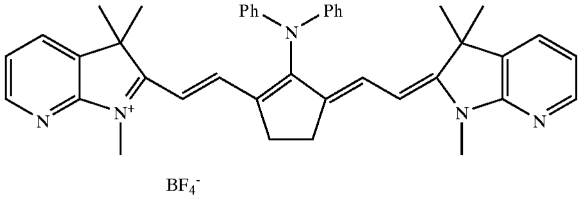
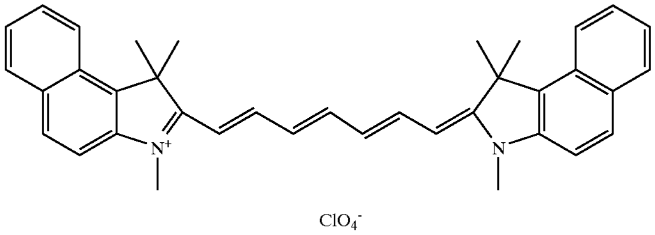
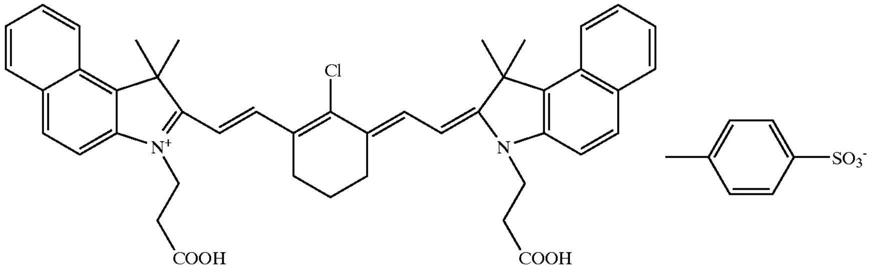
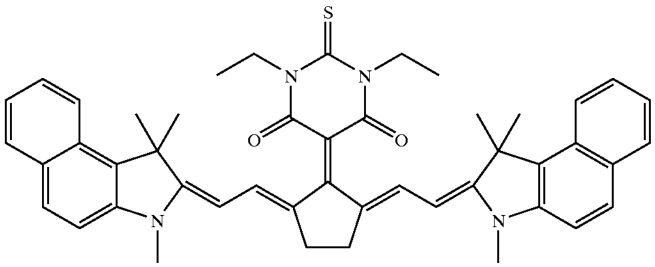
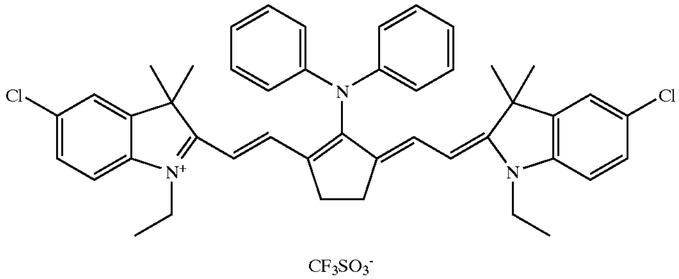

-continued

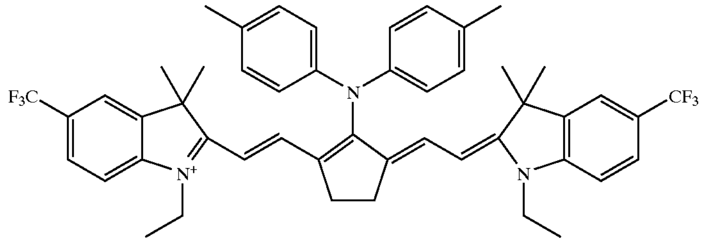

$ClO_4^-$

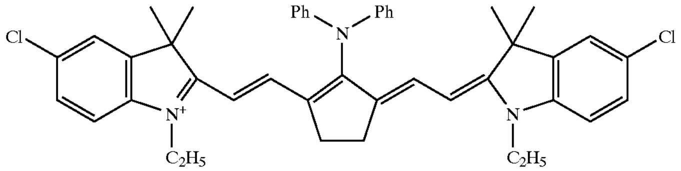

$CF_3SO_4^-$

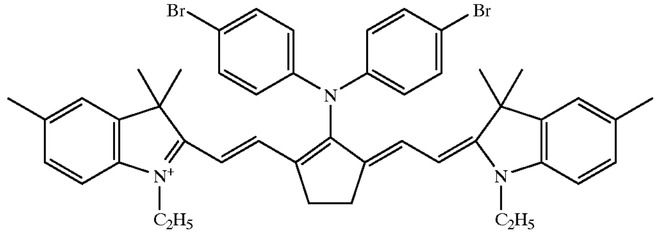

$ClO_4^-$

General formula (b)

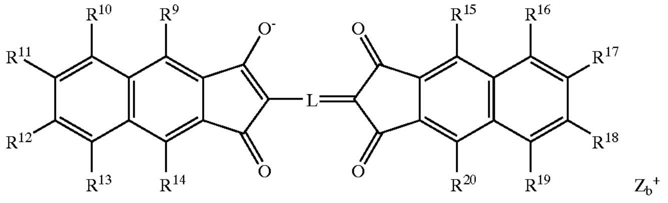

In the above general formula (b), L represents a methine chain having 7 or more conjugated carbon atoms, and this methine chain may have substituents, and the substituents may be connected to each other to form a ring structure. $Zb^+$ represents a counter ion. As the preferable counter ion, ammonium, iodonium, sulfonium, phosphonium, pyrydinium, alkali metal cations ($Ni^+$, $K^+$, $Li^+$) and the like are listed. $R^9$ to $R^{14}$ and $R^{15}$ to $R^{20}$ each represents independently a hydrogen atom or a substituent selected from, or obtained by combining two or three of, halogen atoms, cyano groups, alkyl groups, aryl groups, alkenyl groups, alkynyl groups, carbonyl groups, thio groups, sulfonyl groups, sulfinyl groups, oxy groups and amino groups, and may be connected to each other to form a ring structure. Here, those of the above-mentioned general formula (b) in which L represents a methine chain having 7 or more conjugated carbon atoms and $R^9$ to $R^{14}$ and $R^{15}$ to $R^{20}$ all represent a hydrogen atom are preferable from the standpoints of easy availability and effect.

As the specific examples of the dye of the general formula (b) which can be suitably used in the present invention, those exemplified below are listed.

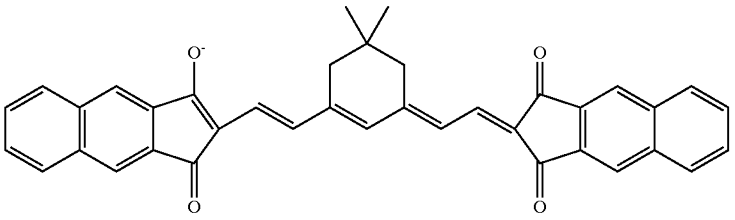

$n\text{-}Bu_4N^+$

-continued

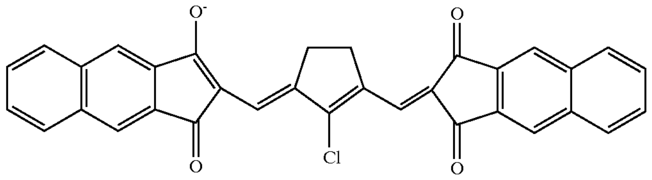

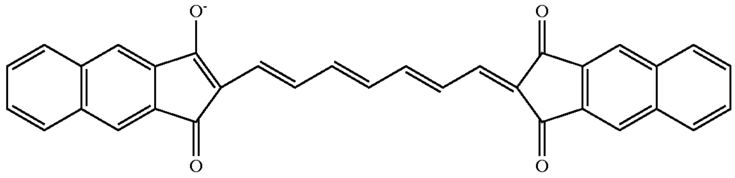

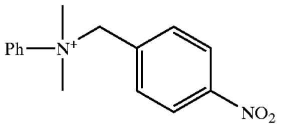

$Me_4N^+$

General formula (c)

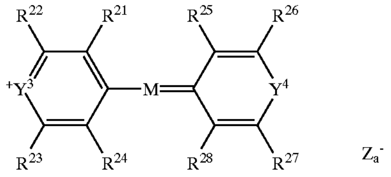

In the above general formula (c), each of $Y^3$ and $Y^4$ represents an oxygen atom, sulfur atom, selenium atom or tellurium atom. M represents a methine chain having 5 or more conjugated carbon atoms. $R^{21}$ to $R^{24}$ and $R^{25}$ to $R^{28}$ maybe the same or different, and represent a hydrogen atom, halogen atom, cyano group, alkyl group, aryl group, alkenyl group, alkynyl group, carbonyl group, thio group, sulfonyl group, sulfinyl group, oxy group or amino group. In the formula, $Za^-$ represent a counter anion and has the same definition as for $Za^-$ in the above-mentioned general formula (a).

As the specific examples of the dye of the general formula (c) which can be suitably used in the present invention, those exemplified below can be listed.

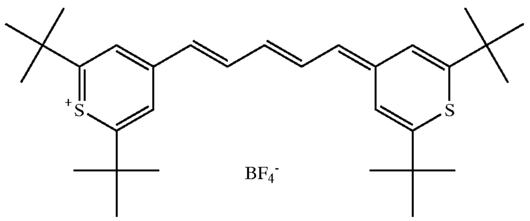

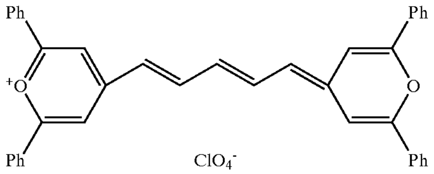

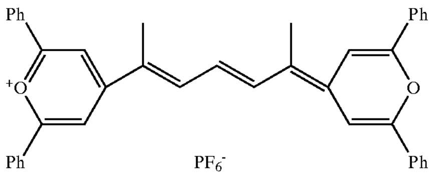

-continued

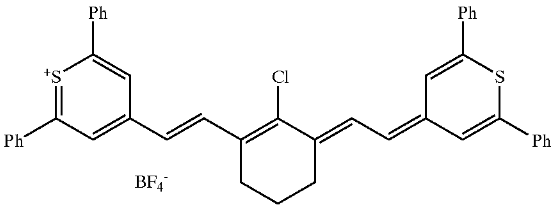

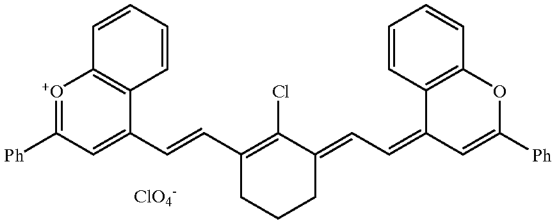

General formula (d)

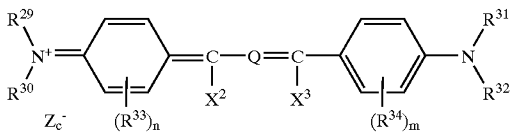

In the above-mentioned general formula (d), $R^{29}$ and $R^{31}$ each represents independently a hydrogen atom, alkyl group or aryl group. $R^{33}$ and $R^{34}$ represent each independently an alkyl group, substituted oxy group or halogen atom. n and m each represents independently an integer of 0 to 4. $R^{29}$ and $R^{30}$ or $R^{31}$ and $R^{32}$ may be connected to each other to form a ring, or $R^{29}$ and/or $R^{30}$ may be connected with $R^{33}$ to form a ring, and/or $R^{31}$ and/or $R^{32}$ may be connected with $R^{34}$ to form a ring. Further, when a plurality of $R^{33}$s or $R^{34}$s are present, at least one of $R^{33}$s may be connected to each other to form a ring or at least one of $R^{34}$s may be connected to each other to form a ring. $X^2$ and $X^3$ each represents independently a hydrogen atom, alkyl group or aryl group, and at least one of $X^2$ and $X^3$ represents a hydrogen atom or alkyl group. Q represents a trimethine group or pentamethine group optionally having a substituent, and may be form a ring structure with a divalent organic group. $Zc^-$ represent a counter anion and has the same definition as for $Za^-$ in the above-mentioned general formula (a).

As the specific examples of the dye of the general formula (d) which can be suitably used in the present invention, those exemplified below are listed.

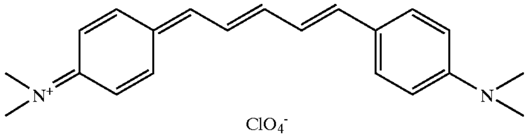

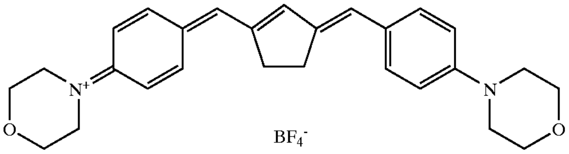

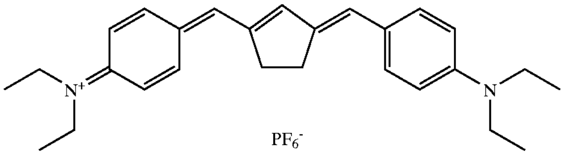

-continued

General formula (e)

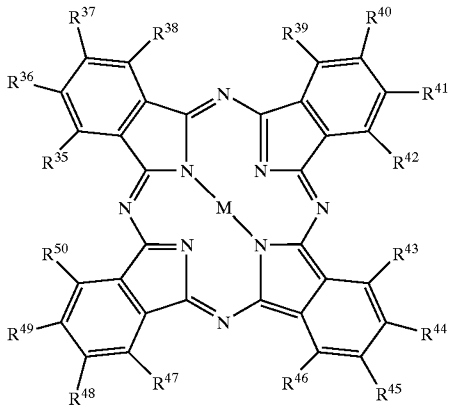

In the above-mentioned general formula (e), $R^{35}$ to $R^{50}$ each represents independently a hydrogen atom, halogen atom, cyano group, alkyl group, aryl group, alkenyl group, alkynyl group, hydroxyl group, carbonyl group, thio group, sulfonyl group, sulfinyl group, oxy group, amino group, or onium salt structure, optionally having a substituent. M represents two hydrogen atoms or metal atom, halometal group or oxymetal group, and as the metal atom contained therein, IA, IIA, IIIB and IVB group atoms, transition metals of first, second and third periods in the periodic table are listed, and lanthanoid elements, and of them, copper, magnesium, iron, zinc, cobalt, aluminum, titanium and vanadium are preferable.

As the specific examples of the dye of the general formula (e) which can be suitably used in the present invention, those exemplified below can be listed.

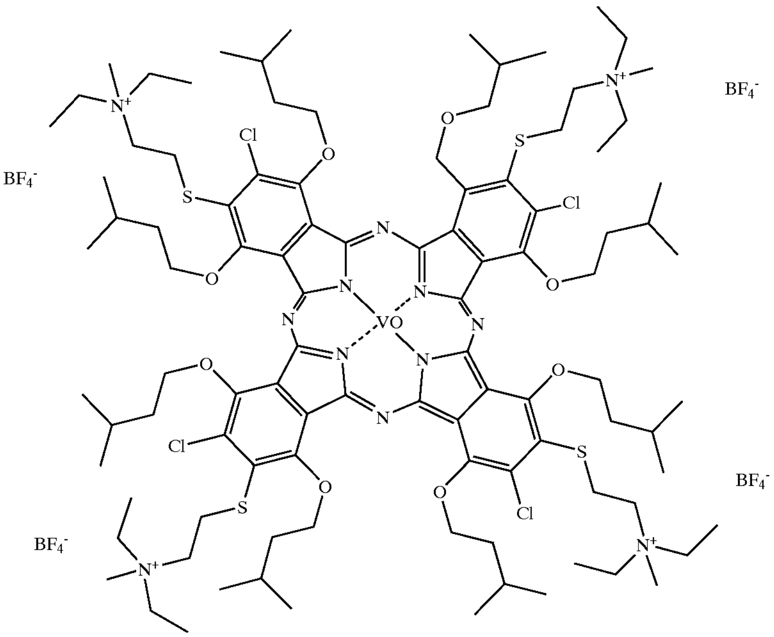

-continued

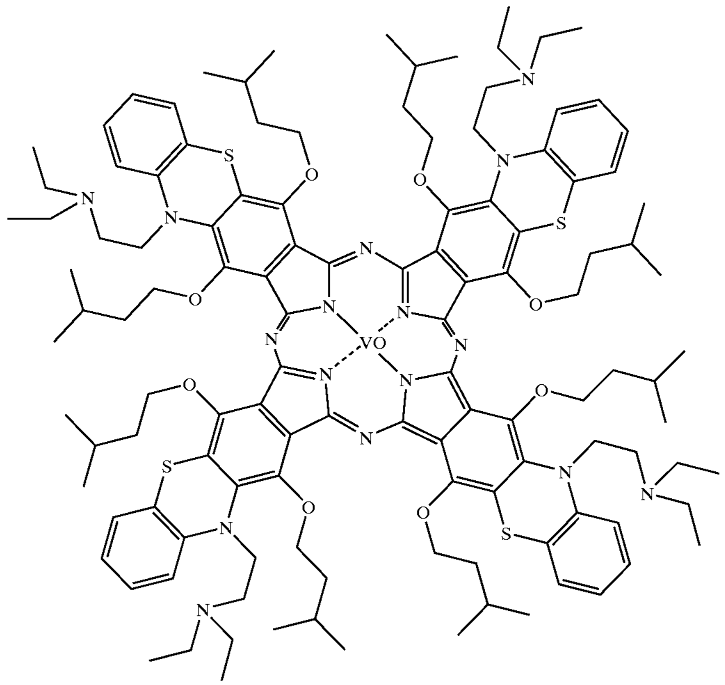

As the pigment used as a light-heat converting agent in the present invention, commercially available pigments and pigments described in Color Index (C.I.) Handbook, "Current Pigment Handbook (Saishin Ganryo Binran)" (edited by Japan Pigment Technology Institution, published in 1977), "Current Pigment Application Technology (Saishin Ganryo Oyo Gijutsu)" (CMC publication, published in 1986), "Printing Ink Technology (Insatsu Inki Gijutsu)" (CMC publication, published in 1984), are listed.

Examples of the pigment include black pigments, green pigments, yellow pigments, orange pigments, brown pigments, red pigments, violet pigments, blue pigments, green pigments, fluorescent pigments, metal powder pigments, and the like, and polymer bonding type coloring materials. Specific examples thereof include insoluble azo pigments, azolake pigments, condensed azo pigments, chelate azo pigments, phthalocyanine-based pigments, anthraquinone-based pigments, perylene and perynone-based pigments, thioindigo-based pigments, quinacridone-based pigments, dioxazine-based pigments, isoindolinone-based pigments, quinophthalone-based pigments, staining lake pigments, azine pigments, nitroso pigments, nitro pigments, natural pigments, fluorescent pigments, inorganic pigments, carbon black. Of these pigments, preferable pigment is carbon black.

These pigments may be used without surface treatment, or may be subjected to surface treatment before used. As the method of surface treatment, a method of coating a resin or wax on the surface of the pigment, a method of adhering a surfactant, a method of bonding a reactive substance (for example, silane coupling agent, epoxy compound, polyisocyanate and the like) to the surface of a pigment, and other methods are envisaged. The above surface treatment methods are described in "Property and Application of Metal Soap (Kinzoku Sekken no Seishitsu to Oyo)" (Sachi Shobo), "Printing Ink Technology (Insatsu Inki Gijutsu)" (CMC publication, published in 1984) and "Novel Pigment Applied Technology (Saishin Ganryo Oyo Gijutsu)" (CMC publication, published in 1986).

The particle size of a pigment is preferably in the range of from 0.01 μm to 10 μm, further preferably in the range of from 0.05 μm to 1 μm, particularly preferably in the range of from 0.1 μm to 1 μm. When the particle size of a pigment is less than 0.01 μm, stability of dispersed substances (pigment) in image photosensitive layer application liquid is not preferable, and when over 10 μm, uniformity of an image photosensitive layer is not preferable.

As the method of dispersing a pigment, known dispersing techniques used in ink production, toner production and the like can be used. Examples of the dispersing machine include an ultrasonic disperser, sand mill, attriter, pearl mill, super mill, ball mill, impeller, disperser, KD mill, colloid mill, Dynatron, three roll mill, press kneader. The details thereof are described in "Current Pigment Application Technology (Saishin Ganryo Oyo Gijutsu)" (CMC publication, published in 1986).

In the present invention, these light-heat converting agents may be used alone or in combination of two or more, and from the standpoint of sensitivity, coloring materials of the general formula (a) are preferably used, and among them, cyanine coloring materials having a diarylamino group and coloring materials in which $X^1$ represents $—NAr^3_2$ are most preferable.

These light-heat converting agents may be added into the same layer which comprises the other components, alternatively, another layer may be provided to which the light-heat converting agents are added. Further it is preferable that, when a photosensitive layer of a negative planographic printing plate precursor is produced (film making), the optical density of the photosensitive layer is from 0.1 to 3.0 at absorption maximum in the wavelength range of from 760 nm to 1200 nm. Out of this range, the sensitivity tends to decrease. Since the optical density is determined depending on the addition amount of the above-mentioned infrared ray absorbing agent and the thickness of the photosensitive layer, desired optical density is obtained by controlling or adjusting the conditions of both parameters. The optical density of the photosensitive layer can be measured by an ordinary method. Examples of the measuring method is, for example, a method in which a photosensitive layer is formed on a transparent or white substrate such that it has appropriate thickness after drying in an application amount range required to form a planographic printing plate, and the optical density is measured by an optical densitometer of transmission type, a method in which a photosensitive layer is formed on a reflective substrate such as aluminum and the like and the reflection density is measured, and other methods.

These light-heat converting agents are added into a heat sensitive composition, in an amount of from 0.1 to 20% by weight based on the total solid components in the composition. When it is too lower than this range, a tendency occurs in which the sensitivity of property change caused by exposure lowers and sufficient photosensitivity is not obtained, and when it is too higher than this range, a tendency occurs in which uniformity and strength of a film decrease. Therefore, both cases thereof are undesirable.

[Compound Having Polymerizable Unsaturated Group (B-II)]

The compound having a polymerizable unsaturated group used in the present invention is an addition-polymerizable compound having at least one ethylenically unsaturated bond, and preferably selected from compounds having at least one, preferably two or more end ethylenically unsaturated bonds. Such compound groups are widely known in this industrial field, and these can be used in the present invention, without particularly restriction.

The compound (B-I) which is suitable for production of a planographic printing plate precursor having high sensitivity, which is one object of the first embodiment of the present invention, includes compounds (B-II) having a polymerizable unsaturated group.

Examples of these compounds include compounds having chemical forms such as monomers, prepolymers, namely, dimers, trimers and oligomers, or mixtures thereof and copolymers thereof.

Examples of the monomers and copolymers thereof include unsaturated carboxylic acids such as acrylic acid, methacrylic acid, itaconic acid, crotonic acid, isocrotonic acid, maleic acid, and esters and amides thereof. Preferable examples thereof include esters obtained from unsaturated carboxylic acids and aliphatic polyhydric alcohol compounds, and amides obtained from unsaturated carboxylic acids and aliphatic polyvalent amine compounds. Further, unsaturated carboxylates having a nucleophil substituent such as a hydroxyl group, amino group, mercapto group and the like, adducts obtained from amides and monofunctional or polyfunctional isocyanates or epoxys, dehydration condensed reaction products obtained from amides and monofunctional or polyfunctional carboxylic acids, and the like are also suitably used.

Furthermore, unsaturated carboxylates having an electrophil substituent such as an isocyanate group, epoxy group and the like; adducts obtained from amides and monofunctinal or polyhydric alcohols, amines or thiols; unsaturated carboxylates having a leaving type substituent such as a halogen group, tosyloxy group and the like; substituted products obtained from amides and monofunctional or polyhydric alcohols, amines or thiols, are also suitable. It is also possible to use compounds which are obtained by using an unsaturated phosphonic acid, styrene, vinyl ether and the like instead of the above-mentioned unsaturated carboxylic acids.

Specific examples of the monomer of the ester obtained from an aliphatic polyhydric alcohol compound and an unsaturated carboxylic acid, include acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, and polyester acrylate oligomer.

Examples of the methacrylates as a monomer include tetramethylene glycol dimethacrylate, triethylene glycol dimethacryalte, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropyl)phenyl]dimethylmethane, and bis-[p-(methacryloxyethoxy)phenyl]dimethylmethane.

Examples of the itaconates as a monomer include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonates as a monomer include ethylene glycol dicrotonate, tetramethylene glycol dicrotonate, pentaerythritol dicrotonate, and sorbitol tetradicrotonate.

Examples of the isocrotonates as a monomer include ethylene glycol diosocrotonate, pentaerythritol diisocrotonate, and sorbitol tetraisocrotonate.

Examples of maleates include ethylene glycol dimaleate, triethylene glycol dimaleate, pentaerythritol dimaleate, and sorbitol tetramaleate.

As examples of other esters, for example, aliphatic alcohol-based esters described in JP-B Nos. 46-27926 and 51-47334, and JP-A No. 57-196231, those having an aromatic skeleton structure described in JP-A Nos. 59-5240, 59-5241 and 2-226149, esters containing an amino group described in JP-A No. 1-165613, and the like are suitably used.

Further, the above-mentioned ester monomers can be used singly or in combination of two or more.

Specific examples of an amide obtained from an aliphatic polyvalent amine compound and an unsaturated carboxylic acid as a monomer, include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide.

Examples of the other preferable amide-based monomers include those having a cyclohexylene structure described in JP-B No. 54-21726.

Furthermore, urethane based addition polymerizable compounds obtained by an addition reaction of an isocyanate and a hydroxyl group are also suitable. Specific examples thereof include vinylurethane compounds containing two or more polymerizable vinyl groups in the molecule, which is obtained by adding a vinyl monomer containing a hydroxyl group of the following formula to a polyisocyanate compound having two or more isocyanate groups in the group described in JP-B No. 48-41708, and other compounds are listed.

$CH_2{=}C(R)COOCH_2CH(R')OH$

In the above-mentioned formula, R and R' represent H or $CH_3$.

Urethane acrylates described in JP-A No. 51-37193 and JP-B Nos. 2-32293 and 2-16765, and urethane compounds having an ethylene oxide-based skeleton structure described in JP-B Nos. 58-49860, 56-17654, 62-39417 and 62-39418 are also suitable.

Further, by using addition-polymerizable compounds having an amide structure or a sulfide structure in the molecule described in JP-A Nos. 63-277653, 63-260909 and 1-105238, a photosensitive compound excellent extremely in sensitizing speed can be obtained.

Other examples thereof include polyfunctional acrylates and methacrylates such as polyester acrylates, epoxy acrylates obtained by reacting epoxy resins and (meth)acrylic acid and the like, as described in JP-A No. 48-64183 and JP-B Nos. 49-43191 and 52-30490. Further, specific unsaturated compounds described in JP-B Nos. 46-43946, 1-40337 and 1-40336, vinylphosphonic acid based compounds described in JP-A No. 2-25493, and the like are also usable. In some cases, compounds having structures containing perfluoroalkyl group described in JP-A No. 61-22048 are suitably used. Moreover, those introduced as photo-curing monomers and oligomers described in Japan Adhesive Institution Journal (Nippon secchaku kyoukaishi) vol. 20, No. 7, 300 to 308 (1984) can also be used.

Details of use such as structures used, single or combination use, and addition amount, of these addition-polymerizable compounds can be optionally selected depending on required final design and abilities of a sensitive material. For example, they can be selected in view of the following points. From the standpoint of photosensitizing speed, a structure having large content of unsaturated groups per molecule is preferable, and in many cases, those of difunctional or more functional is preferable. In order to increase a strength of an image portion (a hardened film), trifunctional or more functional thereof is advantageous. Further, it is also effective to control both of photosensitivity and strength by using a compound having different functional number and different polymerization property (for example, acrylates, methacrylates, styrene-based compounds, vinyl ether-based compounds), in addition to the aforementioned addition polymerizable compound. However, in some cases, compounds having large molecular weight and compounds having high hydrophobicity are not preferable owing to inferior development speed and precipitation in a developer, though they are excellent in sensitizing speed and film strength.

Selection and use of the addition-polymerizable compound are very important factors in view of dispersibility and compatibility with other components (for example, binder polymer, initiator, coloring agent and the like) in a composition constituting a photosensitive layer. Compatibility may be improved due to use of a low purity compound and/or use of two or more addition-polymerizable compounds in combination. When a planographic printing plate precursor is formed, it may also be possible to select specific structure for the purpose of improving close adherence between a substrate, photosensitive layer, over coat layer and the like described below. Regarding the compounding ratio of an addition-polymerizable compound in a composition for forming a photosensitive layer (hereinafter, appropriately referred to as a photosensitive composition), a larger amount of the addition-polymerizable compound is advantageous from the standpoint of sensitivity. However, when the amount is too large, undesirable phase separation may occur, problems regarding production process (for example, unpreferable transfer of sensitive material components, and production failure derived from adhesion) due to stickiness of the composition for forming a photosensitive layer may occur, and when a planographic printing plate precursor is formed with the compound, problems such as precipitation from a developer and the like may occur. From these facts, the preferable amount thereof is, in general, from 5 to 80% by weight, preferably from 25 to 75% by weight, based on total solid components in the composition. The addition-polymerizable compound may be used alone or in combination of two or more. Additionally, suitably use of the addition-polymerizable compound, such as appropriate structure, composition ration, and addition amount can be optionally selected depending on an extent of polymerization inhibition against oxygen, resolution, fogging property, refractive index change, surface stickiness and the like. Further, layer constitutions and application methods such as under coat and overcoat can also be effected.

[Binder (D)]

In a planographic printing plate precursor of the present invention, or when used in a planographic printing plate precursor, it is preferable to further add a binder polymer in a photosensitive layer for the purpose of improving film property, and the like. Linear organic higher molecular weight polymers which are water-soluble and weak alkali aqueous solution-soluble are preferable as the binder. Any public polymers known as "linear organic higher molecular weight polymer" can be selected and used. Preferable polymer thereof is a linear organic higher molecular weight polymer which is water-soluble or swellable, or weak alkali aqueous solution-soluble or swellable, enabling water development or weak alkali aqueous solution development. The linear organic higher molecular weight polymer is selected and used depending on uses as a film-forming agent of the composition. The linear organic higher molecular weight polymer is also selected and used, such that a water, weak alkali aqueous solution or organic solvent developer which is utilized taken into consideration. For example, when a water-soluble organic higher molecular weight polymer is used, water development becomes possible. Examples of the linear organic higher molecular weight polymer include an addition polymers having a carboxyl group on the side chain, such as methacrylic acid copolymers, acrylic acid copolymers, itaconic acid copolymers, crotonic acid copolymers, maleic acid copolymers, and partially-esterified maleic acid copolymers, those described in JP-A No. 59-44615, JP-B Nos. 54-34327, 58-12577 and 54-25957, and JP-A Nos. 54-92723, 59-53836 and 59-71048. Examples thereof also include acidic cellulose derivatives having a carboxyl group on the side chain. Additionally, those obtained by adding a cyclic acid anhydride to an addition polymer having a hydroxyl group and the like are useful.

Among these compounds, benzyl (meth)acrylate/(meth) acrylic acid/optional other addition-polymerizable vinyl monomers copolymers and allyl (meth)acrylate/(meth) acrylic acid/optional other addition-polymerizable vinyl monomers copolymers are excellent in balance of film strength, sensitivity and developing property, and therefore preferable.

Moreover, urethane-based binder polymers having an acid group described in JP-B Nos. 7-12004, 7-120041, 7-120042, 8-12424, JP-A Nos. 63-287944, 63-287947, 1-271741, Japanese Patent Application No. 10-116232 and the like are extremely excellent in strength. Therefore, they are advantageous in printing resistance and low exposure suitability.

Binders having an amide group described in JP-A No. 11-171907 are also suitable since it has excellent developing property and film strength together.

Polyvinylpyrrolidone and polyethylene oxide and the like are also useful as the water-soluble linear organic polymer. For enhancing the strength of a hardened film, also useful are alcohol-soluble nylon, a polyether such as those obtained from 2,2-bis-(4-hydroxyphenyl)-propane and epichlorohydrin, and the like. These linear organic higher molecular weight polymers can be used, and mixed in any amount into the whole composition. However, when the amount of the polymer is 90% by weight or more, a preferable result is not obtained in the strength of an image formed, and the like. The preferable amount thereof is from 30 to 85% by weight based on the total solid components. It is preferable to use a photo-polymerizable compound having an ethylenically unsaturated double bond and the linear organic higher molecular weight polymer in a weight ratio of 1/9 to 7/3.

Polymer, which is substantially insoluble in water and soluble in an alkali aqueous solution, is used as the binder polymer according to the present invention. Therefore, an organic solvent which is not preferable for environment is not used in a developer, or the use amount thereof can be limited to extremely low level. The acid value (acid content per g of polymer, it is shown as chemical equivalent value) and the molecular weight of such a binder polymer are appropriately selected depending on a required image strength and developing property. The preferable acid value thereof is from 0.4 to 3.0 meq/g, and the preferable molecular weight thereof is from 3000 to 500000, more preferably, the acid value thereof is from 0.6 to 2.0 and the molecular weight thereof is from 10, 000 to 300,000.

[Other Component (E)]

In the photosensitive layer in the planographic printing plate precursor of the present invention, or in the composition of the present invention which is used in a photosensitive layer, other components suitable for its use, production method and the like can be further added appropriately thereto. Preferable additives as other components are exemplified below.

(E-1) Cosensitizer

Sensitivity of a photosensitive layer can be further improved by using certain kinds of additives (hereinafter, referred to as cosensitizer). Though the action and function mechanisms of them are not definite, it is supposed that many of them are based on the following chemical process. Namely, it is estimated that a cosensitizer is reacted with various intermediate active species (radical, cation and the like) which are generated in a light reaction initiated with a heat polymerization initiator and in a process of the subsequent addition polymerization reaction, to form a new active radical. These are largely classified into (a) those reduced to generate an active radical, (b) those oxidized to generate an active radical, and (c) those reacting with a radical having low activity to be converted into a radical having higher activity or to act as a chain transfer agent. However, there is no general theory in many cases regarding belongings of respective compounds.

(a) Compound which Generate Active Radical Due to Reduction Thereof

Compound having a carbon-halogen bond: it is supposed that a carbon-halogen bond is reductively cleaved, to generate an active radical. Suitable examples thereof include trihalomethyl-s-triazines and trihalomethyloxadiazoles.

Compound having a nitrogen-nitrogen bond: It is supposed that a nitrogen-nitrogen bond is reductively cleaved, to generate an active radical. Specifically, hexaarylbiimidazoles and the like are suitably used.

Compound having an oxygen-oxygen bond: it is supposed that an oxygen-oxygen bond is reductively cleaved, to generate an active radical. Specifically, for example, organic peroxides and the like are suitably used.

Onium compound: it is supposed that a carbon-hetero bond or an oxygen-nitrogen bond is reductively cleaved, to generate an active radical. Specific examples thereof include diaryliodonium salts, triarylsulfonium salts and N-alkoxypyridinium (azinium) salts.

Ferrocene, iron allene complexes: an active radical can be reductively generated.

(b) Compound which Generate Active Radical Due to Oxidation Thereof

Alkylate complex: it is supposed that a carbon-hetero bond is oxidatively cleaved, to generate an active radical. Specific example thereof includes triaryl alkyl borates.

Alkylamine compound: it is supposed that a C—X bond on a carbon which is adjacent to nitrogen is cleaved due to oxidation, to generate an active radical. As examples of X, a hydrogen atom, carboxyl group, trimethylsilyl group, benzyl group and the like are suitable. Specific examples thereof include ethanolamines, N-phenylglycines, and N-trimethylsilylmethylanilines.

Sulfur-containing, or tin-containing compound: those compound obtained by substituting a nitrogen atom of the above-mentioned amines by a sulfur atom or tin atom can generate an active radical by the same action of the amines. It is known that a compound having an S—S bond can provide sensitization by S—S cleavage thereof.

α-substituted methylcarbonyl compound: an active radical can be generated by cleavage of a bond between carbonyl and a carbon by oxidation. Those obtained by converting carbonyl into oxime ether have the same function. Specific examples thereof includes 2-alkyl-1-[4-(alkylthio)phenyl]-2-morpholinopropanone-1s and, oxime ethers which is obtained by reacting them with hydroxyamines, and etherifying N—OH of the reaction product.

Sulfinic acid salts: An active radical can be reductively generated. Specifically, sodium arylsulfinate and the like are listed.

(c) Compound reacting with radical to convert radical into highly active radical, or to act as chain transfer agent: for example, compounds having SH, PH, SiH or GeH in the molecule are listed and used. These compounds impart hydrogen to radical species having low activity to generate a radical, or after these compounds is oxidized, a proton is removed therefrom to generate a radical. Specific examples thereof include 2-mercaptobenzimidazoles.

More specific examples of these cosensitizers are widely described as additives intending improvement in sensitivity in JP-A No. 9-236913, and these can be applied also in the present invention.

Further, these cosensitizers can be used singly or in combination of two or more. It is preferable that the amount thereof is from 0.05 to 100 parts by weight, preferably from 1 to 80 parts by weight, further preferably from 3 to 50 parts by weight based on 100 parts by weight of the compound having an ethylenically unsaturated double bond.

(E-2) Polymerization Inhibitor

In the present invention, it is desirable to add and use a small amount of heat polymerization inhibitor in order to inhibit unnecessary heat polymerization of a compound having a polymerizable ethylenically unsaturated double bond during a production or preservation of the photosensitive composition, in addition to the above-mentioned basic components. Suitable examples of heat polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis (4-methyl-6-t-butylphenol) and N-nitrosophenylhydroxyamine primary cerium salt. The amount of the heat polymerization inhibitor is preferably from about 0.01 to about 5% by weight based on the weight of the total solid components of the composition. Further, when a higher fatty acid derivative such as behenic acid and behenic amide is added for preventing polymerization inhibition by oxygen to obtain a planographic printing plate precursor, the derivative may be allowed to exist locally on the surface of a photosensitive layer, if necessary, in a process for drying after application onto a substrate and the like. The addition amount of the higher fatty acid derivative is preferably from about 0.5 to 10% by weight based on the total solid components of the composition.

(E-3) Coloring Material and the Like

A dye or pigment may be added to the photosensitive layer for the purpose of coloring of a photosensitive layer (recording layer). By this, when a printing plate is formed, so-called plate inspecting properties such as visibility after plate-making and aptitude for image density measuring machine can be improved. As the coloring material, use of a pigment is particularly preferable, since many dyes cause unpreferable decrease in sensitivity of a photopolymerization-type photosensitive layer. Specific examples thereof include pigments such as phthalocyanine-based pigments, azo-based pigments, carbon black and titanium oxide, and dyes such as ethyl violet, crystal violet, azo-based dyes, anthraquinone-based dyes and cyanine-based dyes. The addition amount of dyes and/or pigments is preferably from about 0.5% by weight to about 5% by weight based on the total solid components of the composition.

(E-4) Other Additive

Further, in a photosensitive layer of the present invention or when a heat sensitive composition of the present invention is used in a photosensitive layer, known additives such as inorganic fillers and plasticizers may be added thereto in order to improve physical properties of a hardened film, and sensitizers may be added thereto in order to improve ink adhering property on the surface of a photosensitive layer.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerine. When a binder is used for the photosensitive layer, the plasticizer can be added in an amount of 10% by weight or less based on the total weight of the compound having an ethylenically unsaturated double bond and the binder.

Further, a UV initiator, aging cross-linking agent and the like for reinforcing an effect of heating and exposure after development can also be added to the photosensitive layer for the purpose of improving film strength (printing resistance) described below.

Additionally, it is possible to provide additives and/or intermediate layers in order to improve a close adherence between a photosensitive layer and a substrate and to enhance developing removal property of an unexposed portion of the photosensitive layer. For example, due to addition or undercoat of a compound which can provide relatively strong interaction between a substrate and the compound, such as a compound having a diazonium structure, a phosphon compound and the like, a close adherence between the substrate and the photosensitive layer can be improved and printing resistance can be obtained. Further, due to addition or undercoat of a hydrophilic polymer such as polyacrylic acid and polysulfonic acid, development of a non-image portion is improved and stain-preventing property can be improved.

When a heat sensitive composition of the present invention is applied on a substrate for providing a planographic printing plate, various organic solvents can be used in order to dissolve the heat sensitive composition. Examples of the solvent used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethylformamide, dimethylsulfoxide, γ-butyrolactone, methyl lactate and ethyl lactate. These solvents can be used singly or in combination of two or more. The suitable concentration of solid components in an application solution for the photosensitive layer is suitably from 2 to 50% by weight.

It is desirable that a coating amount for the recording layer provided on a substrate is appropriately selected depending on intended use thereof in view of influences such as sensitivity of the recording layer, developing property, and a strength and printing resistance of an exposed film. When the application amount is too small, printing resistance is not sufficient. On the other hand, when the application amount is too large, sensitivity lowers and longer time is necessary for exposure and development treatment, undesirably. Regarding the application amount of the composition for a planographic printing plate precursor of the present invention, it is generally suitable that the weight after drying is in the range of from about 0.1 to 10 $g/m^2$. More preferably, it is in the range from 0.5 to 5 $g/m^2$.

Other layers which can be optionally provided for a planographic printing plate precursor of the present invention are explained below.

[Protective Layer]

A planographic printing plate precursor of the present invention or a planographic printing plate precursor using the composition of the present invention is usually exposed in atmosphere. Therefore, it is preferable that a protective layer is further provided on a photosensitive layer comprising a photopolymerizable composition. In order to enable exposure in atmospheric air, the protective layer prevents from mixing a lower molecular weight compound such as oxygen and basic substances, which present in air, into a photosensitive layer. Those lower molecular weight compounds inhibit an image formation reaction which cause in a photosensitive layer by exposure. Therefore, desired properties for such a protective layer are low permeability of the lower molecular weight compound such as oxygen and the like, excellent permeability of light used for exposure, excellent close adherence with a photosensitive layer, and easy removability in a development process after exposure.

Contrivances and improvement regarding such a protective layer have been conventionally made and described in detail in U.S. Pat. No. 3,458,311 and JP-A No. 55-49729. As a material which can be used in the protective layer, for example, water-soluble polymer compounds which are excellent in crystallinity are advantageously used. Specific examples thereof include water-soluble polymers such as polyvinyl alcohol, polyvinyl pyrrolidone, acidic cellulose, gelatin, gum arabic and polyacrylic acid. Among them, use of polyvinyl alcohol as the main component provides most excellent effects for basic properties such as oxygen blocking ability and development property to remove unnecessary portion. The polyvinyl alcohol used in a protective layer may be partially substituted with an ester, ether or acetal providing in so far as it contains unsubstituted vinyl alcohol unit for imparting necessary oxygen blocking property and water-solubility. Further, other copolymerization components may be partially contained in the polyvinyl alcohol.

As the specific examples of polyvinyl alcohol, polyvinyl alcohol which are hydrolyzed until 71 to 100% thereof and having a molecular weight of from 300 to 2400 are listed. Specific examples thereof include PVA-105, PVA-110, PVA-117, PVA-117H, PVA-120, PVA-124m PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 which are manufactured by Kuraray Co., Ltd.

Components, application amount and the like (selection of PVA, use or unuse of additive and the like) of a protective layer can be selected in view of fogging property, close adherence and scratch resistance, in addition to oxygen blockage and developing removal property. In general, when a hydrolysis ratio of PVA used in the protective layer is higher (when the content of an unsubstituted vinyl alcohol unit in a protective layer is higher) and/or when film thickness is larger, oxygen blocking ability increases since it is advantage in sensitivity. However, when oxygen blocking ability is excessively raised, unnecessary polymerization reactions is caused to the protective layer at the time of production and storage thereof, and unnecessary fogging and broadening of image lines may occur in an image exposure step. Further, close adherence ability of the protective layer at an image portion and scratch resistance are also extremely important for handling of the plate. Namely, when a hydrophilic layer comprised of a water-soluble polymer is laminated on a lipophilic polymerized layer, film peeling between them tends to occur due to lack in adhesive force, and the peeled part causes poor film hardening and the like by inhibition of polymerization due to oxygen.

In view of above problems, various suggestions have been made to improve adhesion between these two layers. For example, U.S. Pat. Nos. 292,501 and 44,563 discloses that sufficient adhesion can be obtained such that an acrylic emulsion or water-insoluble vinylpyrrolidone-vinyl acetate copolymer and the like in an amount of 20 to 60% by weight is mixed into a hydrophilic polymer mainly composed of polyvinyl alcohol, and the mixture is applied on a polymerized layer. Any of known technologies can be applied to a protective layer of the present invention. The methods for applying such a protective layer are described in detail, for example, in U.S. Pat. No. 3,458,311 and JP-A No. 55-49729.

Further, other functions can be imparted to a protective layer. For example, safe light aptitude or suitability to utilized light can be further enhanced without causing decrease in sensitivity, by adding coloring agents (water-soluble dye and the like) which can provide excellent permeability of light having wavelength used for exposure and which can absorb efficiently light having wavelength not contributing to formation of an image.

[Intermediate Resin Layer]

In the image recording material of the present invention, an intermediate resin layer comprising an alkali-soluble polymer can be provided between a substrate and a photosensitive layer containing a photopolymerizable compound, if necessary. By providing, on the intermediate layer, a photosensitive layer containing a photopolymerizable compound, which is an infrared ray sensitive layer and can show property in which solubility into an alkali developer is decreased by exposure, sensitivity to infrared laser is excellent because the photosensitive layer is provided on the exposed surface or regions near the surface. Further, by presence of this intermediate resin layer between a substrate and a photosensitive layer and by the function of this intermediate layer as a heat insulating layer, heat generated by exposure with infrared laser is not diffused in a substrate and utilized efficiently, and further high sensitivity is obtained. It is supposed that, in exposed portions, since a photosensitive layer which has became non-permeable to an alkali developer due to exposure functions as a protective layer for this intermediate resin layer, development stability becomes excellent and an image which is excellent in discrimination can be formed, and storage stability by time is also secured. In non-exposed portions, an un-hardened binder component is dissolved quickly and decomposed in a developer. Further, since the intermediate resin layer, which presents adjacent to a substrate, comprises an alkali-soluble polymer, solubility of unexposed portion in a developer is excellent. Therefore, even when a developer having decreased activity and the like are used, quick dissolution is achieved without generation of unpreferable remaining films, and excellent developing property is obtained.

[Substrate]

The substrate used for a planographic printing plate precursor of the present invention is not particularly limited in so far as it is a plate-shaped material which is stable dimensionally. Example thereof include paper, paper laminated with plastics (for example, polyethylene, polypropylene, polystyrene and the like), metal plates (for example, aluminum, zinc, copper and the like) and plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and the like). The substrate may be a sheet of single component such as a resin film, metal plate and the like, or a laminate of two or more materials such as paper or plastic films on which a metal as those described above is laminated or vapor-deposited, and laminated sheets of different type plastic films.

A polyester film and aluminum plate are preferable as the substrate, and an aluminum plate having excellent dimension stability and is relatively cheep is particularly preferable. Suitable aluminum plate is a pure aluminum plate or an alloy plate comprising aluminum as a main component and a trace amount of other elements. Further, a plastic film laminated or vapor-deposited with aluminum is also preferable. As the other element contained in an aluminum alloy, silicon, iron, manganese, copper, magnesium, chromium, zinc, bismuth, nickel, titanium and the like are listed. The content of other elements in an alloy is at most 10% by weight or less. The particularly suitable aluminum in the present invention is pure aluminum. However, since completely pure aluminum is not produced easily from the viewpoint of refining technology, aluminum containing a slight amount of other elements may also be permissible. Thus, composition of the aluminum plate applied in the present invention is not restricted, and an aluminum plate which comprises a material conventionally known and used can be appropriately utilized.

The thickness of the above-mentioned aluminum plate is from about 0.1 to 0.6 mm, preferably from 0.15 to 0.4 mm, particularly preferably from 0.3 to 0.3 mm.

Prior to roughening treatment of an aluminum plate, degreasing treatment with, for example, a surfactant, organic solvent or alkali aqueous solution and the like is conducted for removing a rolling oil on the surface, if necessary.

The roughening treatment of the surface of an aluminum plate is conducted by various methods. For example, the roughening treatment is conducted by a method of mechanical roughening, a method of dissolving and roughening the surface of the plate electrochemically, and a method of selectively dissolving the surface of the plate chemically. As the mechanical method, known methods such as a ball polishing method, brush polishing method, blast polishing method, buff polishing method and the like can be used. As the electrochemical roughening method, there are methods of roughening the plate in a hydrochloric acid or nitric acid electrolyte using alternating or direct current. Further, as disclosed in JP-A No. 54-63902, a method combining both of the method can also be utilized.

Anodizing treatment can be performed on the roughened aluminum plate in order to enhance a water retaining property and friction resistance of the surface, via alkali etching treatment and neutralization treatment. As the electrolyte used for anodizing treatment of an aluminum plate, various electrolytes, which can form a porous oxide film, can be used. In general, sulfuric acid, phosphoric acid, oxalic acid, chromic acid or mixed acids thereof are used as the electrolytes. The concentration of the electrolytes is appropriately determined depending on the kind of the electrolyte utilized.

Conditions of anodizing cannot be generally limited, since they change variously depending on electrolytes used. However, in general, suitable conditions are such that the concentration of electrolytes is from 1 to 80% by weight, the liquid temperature is from 5 to 70° C., the current density is from 5 to 60 A/dm$^2$, the voltage is from 1 to 100 v and the electrolysis time is from 10 seconds to 5 minutes.

The amount of an anodized film is suitably 1.0 g/m$^2$ or more, and more preferably from 2.0 to 6.0 g/m$^2$. When the amount of an anodized film is less than 1.0 g/m$^2$, printing resistance is insufficient, or a non-image portion on a planographic printing plate tends to be scratched, and so-called "scratch staining" easily occurs in which ink adheres to a scratch portion in printing.

Such anodizing treatment is performed on a surface, which is used for printing, of a substrate of a planographic printing plate. In general, an anodized film is also formed on the rear surface of the substrate at 0.01 to 3 g/m$^2$, since electric force lines reach also over the rear surface.

The hydrophilization treatment of the surface of a substrate is performed after the above-mentioned anodizing treatment, and conventionally known hydrophilization treatment methods can be used. As such a hydrophilization treatment, a method using an alkali metal silicate (for example, sodium silicate aqueous solution) is disclosed in U.S. Pat. Nos. 2,714,066, 3,181,461, 3,280,734 and 3,902, 734. In this method, a substrate is immersed in a sodium silicate aqueous solution or electrolyzed. Additionally, there are methods of treatment using potassium fluorozirconate described in JP-B No. 36-22063, or methods of treatment with polyvinylphosphonic acid as disclosed in U.S. Pat. Nos. 3,276,868, 4,153,461 and 4,689,272, and other methods.

Among them, particularly preferable hydrophilization treatment in the present invention is silicate treatment. The silicate treatment is described below.

The anodized film of the aluminum plate on which the above-mentioned treatment have been performed is immersed in an aqueous solution, in which the concentration of an alkali metal silicate is from 0.1 to 30% by weight, preferably from 0.5 to 10% by weight, and pH thereof at 25° C. is from 10 to 13. For example, an aqueous solution to be used is at 15 to 80° C. and time for immersing is for 0.5 to 120 seconds. When pH of an alkali metal silicate aqueous solution is lower than 10, the solution is gelled, and when higher than 13.0, an oxide film obtained is dissolved. As the alkali metal silicate used in the present invention, sodium silicate, potassium silicate, lithium silicate and the like are listed. As the hydroxide used for increasing pH of an alkali metal silicate aqueous solution, sodium hydroxide, potassium hydroxide, lithium hydroxide and the like are listed. An alkaline earth metal salt and/or IVB group metal salt may be comprised in the above-mentioned treatment solution. Examples of the alkaline earth metal salts include nitrates such as calcium nitrate, strontium nitrate, magnesium nitrate and barium nitrate, and water-soluble salts such as sulfates, hydrochlorides, phosphates, acetates, oxalates and. Examples of the IVB group metal salts include titanium tetrachloride, titanium trichloride, titanium potassium fluoride, titanium potassium oxalate, titanium sulfate, titanium tetraiodide, zirconium chloride oxide, zirconium dioxide, zirconium oxychloride and zirconium tetrachloride. The alkaline earth metal salt or IVB group metal salt can be used singly or in combination of two or more. The preferable amount of the metal salts is from 0.01 to 10% by weight, further preferably from 0.05 to 5.0% by weight.

Since the hydrophilicity on the surface of the aluminum plate can be further improved by silicate treatment, ink does not easily adhere to non-image portions and staining resistance in printing is improved.

A back coat is provided, if necessary, on the rear surface of the substrate. As the back coat layer, preferably used is a coating films comprised of a metal oxide obtained by hydrolysis and polycondensation of an organic or inorganic metal compound described in JP-A No. 6-35174, and a coating films comprised of an organic polymer compound described in JP-A No. 5-45885 and.

Among these coating layers, alkoxy compounds of silicon such as $Si(OCH_3)_4$, $Si(OC_2H_5)_4$, $Si(OC_3H_7)_4$, $Si(OC_4H_9)_4$ and the like are cheap and easily available, and a coating layer of a metal oxide obtained from them is excellent in development resistance, particularly preferably.

[Exposure]

As described above, a planographic printing plate precursor of the present invention can be produced. This planographic printing plate precursor is image-wisely exposed by solid laser or semiconductor laser radiating infrared ray having a wavelength from 760 nm to 1200 nm. Scanning exposure for image formation can be conducted using a known apparatus. As the exposure apparatus, apparatuses of inner drum mode, outer drum mode, flat head mode and the like can be selected and used.

In a planographic printing plate precursor of the present invention, an undesirable polymerization reaction at non-exposed portions by lower energy exposure is suppressed by combination of a specific polymerization initiator of high sensitivity and a polymerization inhibitor, therefore, the planographic printing plate precursor is suitable also for low quenching ratio exposure process and the like, and when applied to such a process, an effect thereof is remarkable.

In the present invention, developing treatment may be conducted directly after laser irradiation, however, it is preferable to conduct heating treatment between a laser exposure process and a development process. Heating treatment is preferably conducted at temperatures from 80 to 150° C. for 10 seconds to 5 minutes. By this heating treatment, laser energy necessary for recording can be decreased, in laser irradiation.

[Development]

A planographic printing plate precursor of the present invention is usually exposed image-wisely by infrared laser, then, preferably, developed with water or an alkaline aqueous solution.

In the present invention, developing treatment may be effected directly after laser irradiation, however, a heating treatment process can also be provided between a laser irradiation process and a development process. Heating treatment is preferably conducted at temperatures from 80 to 150° C. for 10 seconds to 5 minutes. By this heating treatment, laser energy necessary for recording can be decreased, in laser irradiation.

The developer is preferably an alkaline aqueous solution, and the preferable pH range is from 10.5 to 12.5, and it is further preferable to effect developing treatment with an alkaline aqueous solution having pH in the range from 11.0 to 12.5. When an alkaline aqueous solution having pH of less than 10.5 is used, a non-image portion tends to be stained, and when developed with an aqueous solution having pH of over 12.5, there is a possibility of decrease in strength of an image portion.

When an alkaline aqueous solution is used as the developer, conventionally known alkali aqueous solutions can be used as the developer and replenisher of an image recording material of the present invention. Examples of inorganic alkali salts include sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Examples of organic alkali agents include monomethylamine, dimethylamine, trimethyamine, monoethylamine, diethylamine, triethyamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

These alkali agents are used alone or in combination of two or more.

Further, when development is effected using an automatic developing machine, it is known that a large amount of planographic printing plate precursors can be treated without exchanging a developer in a development tank for a long period of time, by adding the same solution as the developer or adding an aqueous solution (replenisher) having higher alkali strength than the developer. Also in the present invention, this replenishing method is preferably applied.

Various surfactants and organic solvents and the like can be added to a developer and a replenisher, according to demands, for the purpose of promoting and suppressing developing property, dispersing development trash and enhancing ink affinity of a printing plate image portion.

Into a developer, a surfactant is added preferably in an amount of 1 to 20% by weight, more preferably in an amount of 3 to 10% by weight. When the addition amount of a surfactant is less than 1% by weight, an effect of improving developing property is not obtained sufficiently, and when added in an amount of over 20% by weight, there easily occur problems such as decrease in strengths such as the friction resistance of an image, and the like.

As the preferable surfactant, anionic, cationic, nonionic and ampholytic surcactants are listed. Specific examples thereof include a sodium salt of lauryl alcohol sulfate, ammonium salt of lauryl alcohol sulfate, sodium salt of octyl alcohol sulfate, for example, a sodium salts of isopropylnaphthalenesulfonic acid, sodium salt of isobutylnaphthalenesulfinic acid, sodium salt of polyoxyethylene glycol mononaphthyl ethyl sulfate ester; alkylarylsulfonate salts such as sodium salt of dodecylbenzensulfonic acid and sodium salt of metanitrobenzensulfonic acid; higher alcohol sulfate esters having 8 to 22 carbon atoms such as secondary sodium alkylsulfate; aliphatic alcohol phosphate ester salts such as a sodium salt of cetylalcohol phosphate ester, sulfonic acid salts of an alkylamide such as $C_{17}H_{33}CON(CH_3)CH_2CH_2SO_3Na$, sulfonic acid salts of a dibasic aliphatic ester such as dioctyl sodium sulfosucciante and dihexyl sodium sulfosuccinate, ammonium salts such lauryltrimethyl ammonium chloride and lauryltrimethyl ammonium methosulfate, amine salts such as stearamideethyldiethylamine acetic acid salt, polhydric alcohols such as a fatty acid monoester of glycerol and fatty acid monoester of pentaerythritol, polyethylene glycol ethyls such as for example polyethylene glycol mononaphthyl ethyl and polyethylene glycol mono(nonylphenol) ethyl.

As the preferable organic solvent, those manifesting solubility in water of about 10% by weight or less are listed, further preferably, this solvent is selected from those manifesting solubility in water of 5% by weight or less. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methycyclohexanol. The content of the organic solvent is suitably from 1 to 5% by weight based on the total weight of a developer in use. The use amount thereof has a close relation with the use amount of a surfactant, and it is preferable to increase the amount of a surfactant when the amount of an organic solvent is increased. The reason for this is that when a large amount an organic solvent is used when the amount of a surfactant is small, the organic solvent is not dissolved, consequently, securement of excellent developing property cannot be expected.

Further, additives such as a defoaming agent and hard water softening agent can also be added to a developer and a replenisher, if necessary. Examples of the hard water-softening agent include polyphosphate salts such as $Na_2P_2O_7$, $Na_5P_3O_3$, $Na_3P_3O_9$, $Na_2O_4P(NaO_3P)PO_3Na_2$, chalgon (sodium polymetaphosphate) and the like. Specific examples thereof include aminopolycarboxylic acids such as ethylenediaminetetraacetic acid, potassium salt thereof, sodium salt thereof; diethylenetriaminepentaacetic acid, potassium salt thereof, sodium salt thereof; triethylenetetraminehexaacetic acid, potassium salt thereof, sodium salt thereof; hydroxyethylethylenediaminetriacetic acid, potassium salt thereof, sodium salt thereof; nitrilotriacetic acid, potassium salt thereof, sodium salt thereof; 1,2-diaminocyclohexanetetraacetic acid, potassium salt thereof, sodium salt thereof; 1,3-diamino-2-propanoltetraacetic acid, potassium salt thereof, sodium salt thereof; organic phosphonic acids such as 2-phosphonobutanetricarboxylic acid-1,2,4, potassium salt thereof, sodium salt thereof; 2-phosphonobutanetricarboxylic acid-2,3,4, potassium salt thereof, sodium salt thereof; 1-phosphonoethanetricarboxylic acid-1,2,2, potassium salt thereof, sodium salt thereof; 1-hydroxyethane-1,1-diphosphonic acid, potassium salt thereof, sodium salt thereof; and aminotri(methylenephosphonic acid), potassium salt thereof, sodium salt thereof. The optimum amount of such a hard water softening agent changes depending on the hardness of hard water used and the use amount, and in general, it is contained in an amount of from 0.01 to 5% by weight, more preferably from 0.01 to 0.5% by weight in a developer in use.

Further, when the planographic printing plate is developed using an automatic developing machine, the developer is fatigued depending on the treated amount, therefore, treating ability may be recovered by using a replenisher or a fresh developer. In this case, it is preferable to effect replenishing according to a method described in U.S. Pat. No. 4,882,246.

As such a developer containing a surfactant, organic solvent, reducing agent and the like, for example, a developer composition comprised of benzyl alcohol, anionic surfactant, alkali agent and water described in JP-A No. 51-77401, a developer composition comprised of benzyl alcohol, anionic surfactant and water-soluble sulfite described in JP-A No. 53-44202, a developer composition containing an organic solvent having a solubility in water at normal temperature of 10% by weight or less, alkali agent and water described in JP-A No. 55-155355, and the like are listed, and they are used suitably also in the present invention.

A printing plate developed using the above-mentioned developer and replenisher is post-treated by washing water, rinse liquid containing a surfactant and the like, and de-sensitizing liquid containing gum arabic, starch derivative and the like. As the post treatment when an image recording material of the present invention is used as a printing plate precursor, these treatments can be variously combined and used.

Recently, for rationalization and standardization of plate making works in plate making and printing business world, automatic-developing machines for printing plate materials are widely used. This automatic developing machine is generally comprised of a developing part and a post treatment part, and comprised of an apparatus of transporting a printing plate material, treating liquid vessels and a spray apparatus, in which treating liquid pumped up is blown from a spray nozzle while horizontally transporting a printing plate already exposed, to effect developing treatment. Recently, there is also known a method in which a printing plate precursor exposed is immersed and transported in a treating liquid vessel filled with treating liquid by a guide roll in the liquid, to effect treatment. In such automatic treatment, treatment can be effected while replenishing a replenishing liquid into treating liquid depending on the treatment amount, operation time and the like. Further, automatic replenishing can also be effected by detecting electric conductivity by a sensor.

Further, a so-called disposable treating method of treating with substantially un-used treatment liquid can also be applied.

A planographic printing plate obtained as described above can be subjected to a printing process, after application of de-sensitizing gum, if necessary. When a planographic printing plate is desired to have more higher printing resistance, burning treatment is performed.

When a planographic printing plate is burned, it is preferable to conduct treatment with surface smoothing liquid (a surface-adjusting solution) as described in JP-B Nos. 61-2518 and 55-28062, JP-A Nos. 62-31859 and 61-159655, before burning.

As such a method, a method in which application is effected on a planographic printing plate with sponge or absorbent cotton impregnated with the surface smoothing liquid, a method in which a printing plate is immersed in a vat filled with surface smoothing liquid, a method of application by an automatic coater, and the like are applied. Further a procedure of, after application, uniformalizing the application amount with a squeegee or squeegee roller gives a more preferable result.

The application amount of surface smoothing liquid is suitably from 0.03 to 0.8 $g/m^2$ (dry weight) in general.

A planographic printing plate on which surface smoothing liquid have been applied is, if necessary after drying, heated at high temperatures by a burning processor (for example, burning processor marketed from Fiji Photo Film Co., Ltd.: BP-1300) and the like. The heating temperature and time in this case are preferably 180 to 300° C. and 1 to 20 minutes respectively depending on the kinds of components forming an image.

A planographic printing plate burnt can be appropriately subjected to conventionally conducted treatments, if necessary, such as water-washing, gumming and the like, and when surface smoothing liquid containing a water-soluble polymer compound and the like is used, a so-called de-sensitizing treatment such as gum drawing and the like can be omitted.

A planographic printing plate obtained by such treatments is applied on an offset printer and the like, and used for printing in many cases.

EXAMPLES

Examples of the first to third aspects of the present invention are described below, however, the scope of the present invention is not limited to them.

Examples of First and Second Aspects

Examples 1 to 10

[Manufacturing of Substrate]

An aluminum plate (material 1050) having a thickness of 0.3 mm was degreased by washing with trichloroethylene, then, the surface was grained using a nylon brush and a pumice of 400 mesh-water suspension and etched, washed with water, then, immersed in 20% nitric acid for 20 seconds, and washed with water. The etching amount of the grained surface in this operation was about 3 $g/m^2$.

A direct electrode oxide film of 3 $g/m^2$ was made on this plate at a current density of 15 $A/dm^3$ using 7% sulfuric acid, then, the plate was washed with water and dried to produce a substrate [A].

Then, the substrate [A] was treated at 25° C. for 15 seconds with a 2 wt % aqueous solution of sodium silicate, to produce a substrate [B].

[Formation of Intermediate Layer]

Then a liquid composition (sol liquid) for SG method was prepared according to the following procedure.

| <Sol liquid compostion> | |
|---|---|
| Methanol | 130 g |
| Water | 20 g |
| 85 wt % phosphoric acid | 16 g |
| Tetraethoxysilane | 50 g |
| 3-methacryloxypropyltrimethoxysilane | 60 g |

The above-mentioned compounds were mixed and stirred. After about 5 minutes, heat generation was observed. After reaction for 60 minutes, the content was transferred to another vessel, and to this was added 300 g of methanol, to obtain sol liquid.

This sol liquid was diluted with methano/ethylene glycol=9/1 (weight ratio), and applied on the substrate [A] produced as described above so that the amount of Si on the substrate was 3 mg/$m^2$, and dried at 100° C. for 1 minute, giving a substrate [C].

[Formation of Planographic Printing Plate Precursor]

Either of the substrate [A] or substrate [C] produced as described above was used as a substrate, and photosensitive layer application liquid of the following composition was applied on its surface, and dried at 115° C. for 1 minute, to form photosensitive layers of 1.4 g/$m^2$, obtaining planographic printing plate precursors of Examples 1 to 10.

The substrate, (A-I) radical generator (described as polymerization initiator in Table 1), (B-II) compound having a polymerizable unsaturated group, (C-I) light-heat converting agent and (D) binder, used are as shown in Table 1 below.

| (Photosensitive layer application liquid) | |
|---|---|
| (A-I) radical generator (compound described in Table 1) | 0.15 g |
| (B-II) polymerizable compound (compound described in Table 1) | 1.5 g |
| (D) binder (compound described in Table 1) | 2.0 g |
| (C-I) light-heat converting agent (compound described in Table 1) | 0.1 g |
| Fluorine-containing nonionic surfactant (Megafac F-177P, manufactured by Dainippon Ink & Chemicals, Inc.) | 0.02 g |
| Dye obtained by substituting a counter anion in Victoria Pure Blue BOH by 1-naphthalenesulfonic acid anion | 0.04 g |
| Methyl ethyl ketone | 10 g |
| Methanol | 7 g |
| 2-methoxy-1-propanol | 10 g |

DX-1

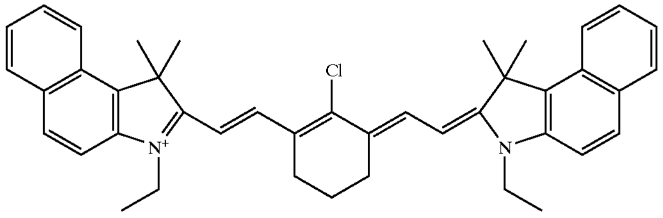

$TsO^-$

DX-2

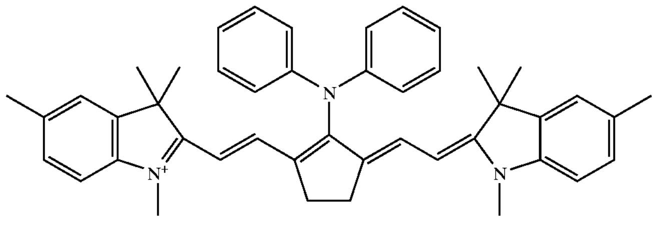

$BF_4^-$

DX-3

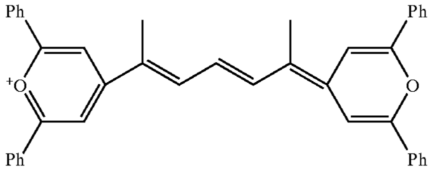

$PF_6^-$

TABLE 1

| | Substrate | Polymerization initiator | Light-heat converting agent | Polymerizable compound | Binder | Developer | Sensitivity (mJ/cm$^2$) | | Sensitivity (mJ/cm$^2$) |
|---|---|---|---|---|---|---|---|---|---|
| Example 1 | A | SA-19 | DX-2 | M-1 | B-1 | D-1 | 80 | Example 11 | 65 |
| Example 2 | B | SA-1 | DX-1 | M-2 | B-2 | DN-3C | 90 | Example 12 | 75 |
| Example 3 | C | SA-18 | DX-3 | M-2 | B-1 | D-1 | 95 | Example 13 | 80 |
| Example 4 | A | SC-1 | DX-2 | M-1 | B-1 | DP-4 | 85 | Example 14 | 70 |
| Example 5 | B | SE-3 | DX-1 | M-2 | B-3 | DP-4 | 90 | Example 15 | 75 |
| Example 6 | C | SH-1 | DX-1 | M-2 | B-1 | DP-4 | 90 | Example 16 | 75 |
| Example 7 | A | IG-10 | DX-2 | M-1 | B-1 | DN-3C | 80 | Example 17 | 65 |
| Example 8 | B | IA-1 | DX-1 | M-1 | B-2 | D-1 | 85 | Example 18 | 70 |
| Example 9 | C | ID-4 | DX-3 | M-2 | B-2 | DP-4 | 90 | Example 19 | 75 |
| Example 10 | B | IF-4 | DX-1 | M-2 | B-2 | DN-3C | 90 | Example 20 | 70 |
| Comparative Example 1 | A | HS | DX-1 | M-2 | B-2 | DN-3C | 110 | Comparative Example 4 | 95 |
| Comparative Example 2 | B | HI | DX-3 | M-2 | B-2 | DP-4 | 105 | Comparative Example 5 | 90 |

(Polymerizable Compound in Table 1)

(M-1)

Pentaerythritol tetraacrylate (M-2)

Glycerin dimethacrylate hexamethylene diisocyanate urethane prepolymer (Binder in Table 1)

| | |
|---|---|
| (B-1)<br>Allyl methacrylate/methacrylic acid/N-isopropylamide copolymer<br>(copolymerization molar ratio: 67/13/20) | |
| Acid value (measured by NaOH titration) | 1.15 meq/g |
| Wight-average molecular weight | 130,000 |
| (B-2)<br>Allyl methacrylate/methacrylic acid copolymer<br>(copolymerization molar ratio: 83/17) | |
| Acid value (measured by NaOH titration) | 1.55 meq/g |
| Weight-average molecular weight | 125,000 |

(B-3)

Polyurethane resin which is a condensate of the following diisocyanates and diols (a) 4,4'-diphenylmethane diisocyanate (b) hexamethylene diisocyanate (c) polypropylene glycol (weight-average molecular weight: 1000)

(d) 2,2-bis(hydroxymethyl)propionic acid ((a)/(b)/(c)/(d) copolymerization molar ratio: 40/10/15/35)

Acid value (measured by NaOH titration) 1.05 meq/g

Weight-average molecular weight 45,000

Comparative Examples 1, 2

For comparison, on the substrate [A] and substrate [B], a photosensitive layer was formed using photosensitive layer application liquids having compositions shown in Table 1 except that onium salts (polymerization initiator) of the following formulae (HS, HI) having no sulfinic acid structure were added as a counter anion instead of the radical generator (polymerization initiator) of the general formula (I) of the above-mentioned photosensitive layer application liquid, obtaining planographic printing plate precursors (Comparative Examples 1, 2).

HS

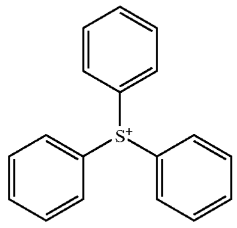

$CH_3SO_3^-$

HI

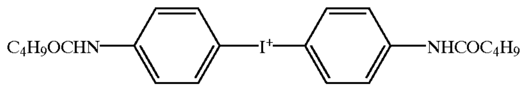

$PF_6^-$

[Exposure, Development]

The resulted planographic printing plate precursor was exposed using semiconductor laser of an output of 500 mW, a wavelength of 830 nm and a beam diameter of 17 μm (l/e$^2$) at a main scanning speed of 5 m/sec., and developed using an automatic developing machine (manufactured by Fuji Photo Film Co., Ltd.: PS processor 900VR) charged with DN3C developer or DP-4 developer manufactured by Fuji Photo Film Co., Ltd. and rinse liquid FR-3 (1:7), and the following evaluations were conducted. Developing liquids used in development treatment are shown in Table 1 together.

[Evaluation of Sensitivity]

The planographic printing plate precursor was exposed with semiconductor laser emitting infrared ray having a wavelength of about 830 to 850 nm. After exposure, development was effected with developers DN-3C manufactured by Fuji Photo Film Co., Ltd. (diluted with water at a ratio of 1:2) or DP-4 manufactured by Fuji Photo Film Co., Ltd. (diluted with water at a ratio of 1:8), and water-washing was conducted. Energy amount necessary for recording was calculated based on the line width of the resulted image, laser output, loss in an optical system, and scanning speed. When the numerical value is smaller, sensitivity is higher.

These evaluation results are shown in Table 1.

From the results in Table 1, it was found that the planographic printing plate precursors of the present invention have high sensitivity. On the other hand, it was found that the planographic printing plate precursors of Comparative Examples 1 and 2 using known radical polymerization initiators were inferior in sensitivity as compared with Examples 2 and 9 obtained under the same conditions except the polymerization initiator.

Examples 11 to 20, Comparative Examples 3, 4

On the recording layers of the planographic printing plate precursors obtained in Examples 1 to 10 and Comparative Example 1 and 2, a 3 wt % aqueous solution of polyvinyl alcohol (degree of saponification: 98 mol %, degree of polymerization: 550) was applied so that the applied amount after drying was 2 g/$m^2$, dried at 100° C. for 2 minutes to obtain planographic printing plate precursors having a protective layer provided on the recording layer, providing Examples 11 to 20 and Comparative Examples 3 and 4, respectively.

The resulted planographic printing plate precursors were subjected to exposure and development under the same conditions as in Examples 1 to 10 and Comparative Examples 1 and 2, to make plates, and the sensitivity was evaluated likewise. The results are described in Table 1 above.

As shown in Table 1, even in the case of provision of a protective layer on a photosensitive layer, the same tendency is observed as in Examples 1 to 10 and Comparative Examples 1 and 2 having no protective layer, the planographic printing plate precursors of the present invention are excellent in sensitivity, and a tendency of improvement in abilities is observed by provision of a protective layer, while, any of the planographic printing plate precursors of Comparative Examples 3 and 4 using onium salts having no sulfinic acid structure as a polymerization initiator is inferior in sensitivity as compared with the examples.

Example 21

[Formation of Intermediate Resin Layer]

The following application liquid for formation of intermediate resin layer was applied on the above-mentioned substrate [A] by a wire bar so that the application amount after drying was 0.6 g/$m^2$, and dried at 120° C. in a hot air type drying apparatus for 45 seconds, to form an intermediate resin layer. Further, on the intermediate resin layer, the following photosensitive layer application liquid 2 was applied by a wire bar so that the total application amount of the intermediate layer and the photosensitive layer was 1.3 g/$m^2$, dried at 120° C. in a hot air type drying machine for 50 seconds to form a photosensitive layer, obtaining a planographic printing plate precursor of Example 21. Further on this photosensitive layer, a 3 wt % aqueous solution of polyvinyl alcohol (degree of saponification: 98 mol %, degree of polymerization: 550) was applied so that the applied amount after drying was 2 g/$m^2$, dried at 10° C. for 1 minute to provide a protective layer on the photosensitive layer, obtaining a planographic printing plate precursor of Example 22.

| (Intermediate resin layer application liquid) | |
|---|---|
| Binder (BN-1) copolymer of N-(p-aminosulfonylphenyl)methacrylamide and butyl acrylate (molar ratio: 35:65, weight-average molecular weight: 60,000) | 2.0 g |
| Fluorine-containig nonionic surfactant | 0.02 g |
| (Megafac F-177P, manufactured by Dainippon Ink & Chemicals, Inc.) | 0.04 g |
| Naphthalenesulfonic acid salt of Victoria Pure Blue | 0.04 g |
| Methyl ethyl ketone | 10 g |
| Methanol | 7 g |
| γ-butyrolactone | 10 g |
| (Photosensitive layer application liquid 2) | |
| (B-II) polymerizable compound [M-1] | 1.5 g |
| (D) binder [B-1] | 2.0 g |
| (C-I) light-heat converting agent [DX-2] | 0.1 g |
| (A-I) radical generator [SA-20] | 0.15 g |
| Flourine-containing nonionic surfactant (Megafac F-177P, manufactured by Dainippon Ink & Chemicals, Inc.) | 0.02 g |
| Napthalenesulfonic acid salt of Victoria Pure Blue | 0.04 g |
| Methyl ethly ketone | 20 g |
| Methanol | 2 g |
| 2-methoxy-1-propanol | 10 g |

(Evaluation of Sensitivity)

The resulted planographic printing plate precursor of Example 21 was exposed, directly after preparation, with semiconductor laser emitting infrared ray having a wavelength of about 830 to 850 nm. After exposure, development was developed with the above-mentioned developer D-1 (diluted with water at a ratio of 1:5), and water-washed. Energy amount necessary for recording was calculated based on the line width of the resulted image, laser output, loss in an optical system, and scanning speed. As a result, the sensitivity of Example 21 was 80 Jm/$cm^2$, revealing high sensitivity. It is known that the planographic printing plate precursor of the present invention can attain high sensitivity even when a stratified structure containing an intermediate resin layer is made.

Example 22

On a polyethylene terephthalate film (thickness: 0.1 mm) as a substrate, the following recording layer application liquid was applied so that the applied amount after drying was 2.0 g/$m^2$, obtaining a transparent recording material of pale yellow color.

| (Recording layer application liquid) | |
|---|---|
| (B-I) oxidation coloring dye (Leuco Crystal Violet) | 0.2 g |
| (D) binder (polymethyl methacrylate) | 2.7 g |
| (A-I) radical generator (SA-1) | 0.3 g |
| Methyl ethyl ketone | 10 g |
| Methanol | 8 g |
| 2-methoxy-1-propanol | 8 g |

This recording material was heated in an over of 200° C. for 15 seconds to allow the recording layer on the substrate to develop color. The recording layer developed vivid blue color. From this fact, it is estimated that, in the recording layer composed of the heat sensitive composition of the present invention containing a radical generator of the general formula (I), the leuco dye was oxidized and developed color by generation of a radical.

In the heat sensitive composition of the first embodiment of the present invention, high sensitive irreversible change in physical properties by heating was possible. A negative planographic printing plate precursor using this heat sensitive composition can be inscribed by infrared laser and recording sensitivity is high.

Example of Third Aspect of the Present Invention

[Synthesis of Divalent Onium Salt]

Sulfonium, iodonium mother skeletons used in the present invention can be synthesized by methods described in JP-A Nos. 11-80118, 11-153870, J. Org. Chem 1992, 57, 6810–6814, Synthesis 1999 p. 1897–1899, Tetrahedoron 1995, vol 51. P6229–6239 and J. Org. Chem 1978, 43, 3058, and these were salt-exchanged to obtain onium salt compounds.

Synthesis Example 1

Synthesis of Exemplary Compound I-1

4.4 g of iodosobenzene (0.02 mol) was dissolved in 50 ml of dichloromethane, and 3.4 ml (0.02 mol) of trifluoromethanesulfonic acid anhydride was added dropwise at room temperature to this, the mixture was stirred for 5 hours, and the precipitated solid was filtrated, washed with ethyl acetate and dried under reduced pressure to obtain a divalent onium salt, exemplary compound I-1) at a yield of 45%.

Synthesis Example 2

Synthesis of Exemplary Compound S-9

1.58 g (2 mmol) of the exemplary compound (I-1) obtained in Synthesis Example 1 was collected, and mixed with 0.018 g (0.1 mmol) of copper (II) acetate and 2.7 ml of diphenyl sulfide, and the mixture was heated at 190° C. for 40 minutes. Then, the mixture was cooled to room temperature, and washed with ethyl acetate and water, to obtain a divalent onium salt, exemplary compound (S-9) at a yield of 40%.

Examples 23 to 32

[Production of Substrate]

Substrates [A], [B] and [C] were obtained in the same manner as in Examples 1 to 10.

[Formation of Photosensitive Layer]

Either of the substrate [A] to substrate [C] was used as a substrate, and photosensitive layer application liquid of the following composition was applied on its surface, and dried at 115° C. for 1 minute, to form photosensitive layers of 1.4 g/m$^2$, obtaining planographic printing plate precursors of Examples 23 to 31. The substrate, (C-II) light-heat converting agent, (B-II) compound having a polymerizable unsaturated group, (A-II) divalent onium salt and (D) binder, used are as shown in Table 2 below.

| (Photosensitive layer application liquid) | |
|---|---|
| Addition-polymerizable compound (compound described in Table 2) | 1.5 g |
| Binder (compound described in Table 2) | 2.0 g |
| Light-heat converting agent (compound described in Table 2) | 0.1 g |
| Polymerization initiator such as divalent onium salt and the like (compound described in Table 2) | 0.15 g |
| Flourine-containing nonionic surfactant (Megafac F-177P, manufactured by Dainippon Ink & Chemicals, Inc.) | 0.02 g |
| Dye obtained by substituting a counter anion in Victoria Pure Blue BOH by 1-naphthalenesulfonic acid anion | 0.04 g |
| Methyl ethyl ketone | 10 g |
| Methanol | 7 g |
| 2-methoxy-propanol | 10 g |

DX-1

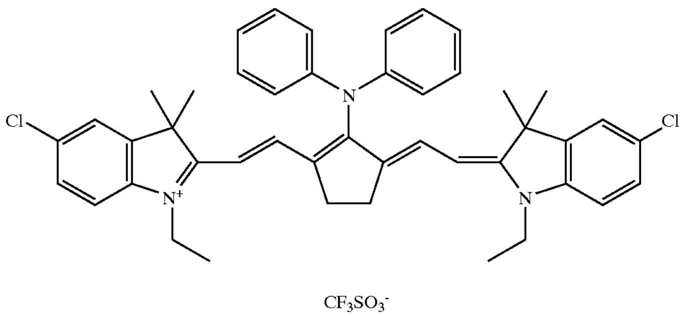

DX-2

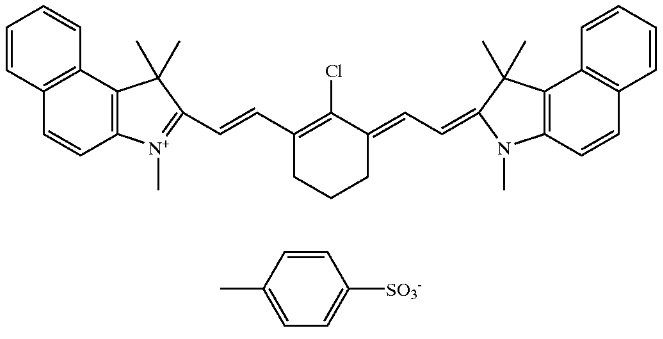

-continued

DX-3

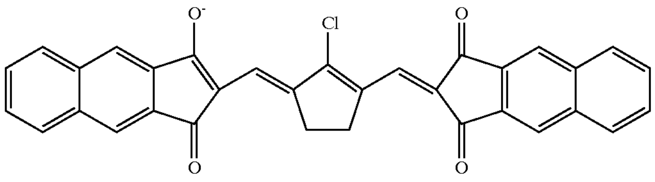

$HNEt_3^+$

TABLE 2

| | Substrate | Polymerization initiator (divalent onium salt) | Light-heat converting agent | Addition-polymerizable compound | Binder | Developer | Sensitivity (mJ/cm$^2$) | | Sensitivity (mJ/cm$^2$) |
|---|---|---|---|---|---|---|---|---|---|
| Example 23 | A | I-1 | DX-2 | M-1 | B-1 | DP-4 | 80 | Example 33 | 70 |
| Example 24 | B | I-8 | DX-3 | M-2 | B-2 | DN-3C | 85 | Example 34 | 75 |
| Example 25 | C | I-33 | DX-1 | M-2 | B-1 | DP-4 | 80 | Example 35 | 70 |
| Example 26 | A | I-3 | DX-1 | M-1 | B-1 | D-1 | 75 | Example 36 | 65 |
| Example 27 | B | I-39 | DX-3 | M-2 | B-3 | DN-3C | 90 | Example 37 | 75 |
| Example 28 | A | S-9 | DX-1 | M-2 | B-1 | DP-4 | 80 | Example 38 | 70 |
| Example 29 | A | S-36/S-37* | DX-2 | M-1 | B-1 | DN-3C | 90 | Example 39 | 75 |
| Example 30 | B | S-33 | DX-1 | M-1 | B-2 | D-1 | 80 | Example 40 | 70 |
| Example 31 | C | S-31 | DX-3 | M-2 | B-2 | DP-4 | 90 | Example 41 | 80 |
| Example 32 | B | S-13 | DX-1 | M-2 | B-2 | DN-3C | 75 | Example 42 | 70 |
| Comparative Example 5 | A | HI | DX-2 | M-1 | B-1 | DP-4 | 100 | Comparative Example 7 | 85 |
| Comparative Example 6 | B | HS | DX-1 | M-1 | B-2 | D-1 | 100 | Comparative Example 8 | 85 |

*mixture in which weight ratio of divalent onium salt S-36 to S-37 is 1:1

(Addition-Polymerizable Compound in Table 2)

The same expression as in Table 1 has the same meaning.

Comparative Examples 5, 6

For comparison, on the substrate [A] and substrate [B], a photosensitive layer was formed using photosensitive layer application liquids having compositions shown in Table 2 except that polymerization initiator (HI, HS) having a monovalent onium salt structure of the following formulae were added instead of the divalent onium salt in the above-mentioned photosensitive layer application liquid, obtaining planographic printing plate precursors (Comparative Examples 5, 6).

HI

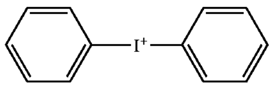

$CF_3SO^-_3$

-continued

HS

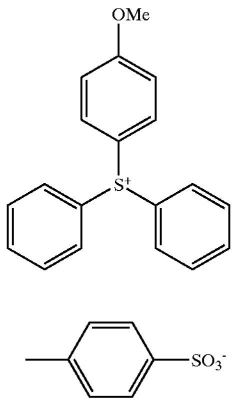

[Exposure, Development]

Exposure and development were conducted in the same manner as in Examples 1 to 10 except that the following D-1 developer is also used. And the sensitivity was evaluated as described below. Developing liquids used in development treatment are shown in Table 2 together.

| (D-1 developer) | |
|---|---|
| Potassium hydroxide | 3.0 g |
| Sodium hydrogen carbonate | 1.0 g |
| Potassium carbonate | 2.0 g |
| Sodium sulfite | 1.0 g |

-continued

| (D-1 developer) | |
|---|---|
| Polyethylene glycol mononaphthyl ether | 150.0 g |
| Sodium dibutylnaphthalenesulfonate | 50.0 g |
| Tetrasodium ethylenediaminetetraacetate | 8.0 g |
| Water | 785 g |

[Evaluation of Planographic Printing Plate Precursor]
(Evaluation of Sensitivity)

The planographic printing plate precursor was developed and washed with water in the same manner as in Examples 1 to 10 except that, after exposure, development was effected with DN-3C manufactured by Fuji Photo Film Co., Ltd. (diluted with water at a ratio of 1:2) or DP-4 manufactured by Fuji Photo Film Co., Ltd. (diluted with water at a ratio of 1:8) and the above-mentioned D-1 developer (diluted with water at a ratio of 1:5).

These evaluation results are shown in Table 2.

From the results in Table 2, it was found that the planographic printing plate precursors of the present invention have high sensitivity. On the other hand, it was found that the planographic printing plate precursors of Comparative Examples 5 and 6 using polymerization initiators having no divalent onium salt structure were inferior in sensitivity as compared with Examples 23 and 30 obtained under the same conditions except the polymerization initiator.

The resulted planographic printing plate precursor was recorded (exposed) in the form of test pattern images by Trendsetter manufactured by Creo under conditions of a beam strength of 9 w and a drum rotation speed of 150 rpm.

First, the planographic printing plate precursor exposed under the above-described conditions was developed using PS processor 900H manufactured by Fuji Photo Film Co., Ltd. charged with the above-mentioned D-1 developer (diluted with water at a ratio of 1:5) and a finisher FP2W (diluted at a ratio of 1:1) manufactured by Fuji Photo Film Co., Ltd. while maintaining the liquid temperature at 30° C. for a development time of 12 seconds. In all of the resulted planographic printing plates, excellent images were formed without generating pollution on non-image portions.

Examples 33 to 42, Comparative Examples 7, 8

On the photosensitive layers of the planographic printing plate precursors obtained in Examples 23 to 32 and Comparative Example 5 and 6, a protective layer was provided in the same manner as in Examples 11 to 20, to obtain planographic printing plate precursors of Examples 33 to 42 and Comparative Examples 7 and 8.

The resulted planographic printing plate precursors were subjected to exposure and development under the same conditions as in Examples 23 to 32, to make planographic printing plates, and the sensitivity was evaluated likewise. The results are described in Table 1 above.

As shown in Table 2, even in the case of provision of a protective layer on a photosensitive layer, the same tendency is observed as in Examples 23 to 32 and Comparative Examples 5 and 6 having no protective layer, the planographic printing plate precursors of the present invention are excellent in sensitivity, and a tendency of improvement in abilities is observed by provision of a protective layer, while, any of the planographic printing plate precursors of Comparative Examples 7 and 8 using polymerization initiators having a monovalent onium salt structure is inferior in sensitivity as compared with Examples 33 and 40 obtained under the same conditions excepting the polymerization initiator.

Examples 43, 44

[Formation of Intermediate Resin Layer]

The following intermediate resin layer formation application liquid [II] was applied by a wire bar on the above-mentioned substrate [A], and dried by a hot air type drying apparatus at 140° C. for 60 seconds, to form an intermediate resin layer. The applied amount after drying was 0.6 g/m$^2$.

| (Intermediate resin layer application liquid [II]) | |
|---|---|
| Binder (BN-2)<br>copolymer having a copolymerization molar ratio of N-(p-aminosulfonylphenyl)methacrylamide and methacrylic acid and methyl methacrylate of 50/25/25, weight-average molecular weight: 60,000 | 2.0 g |
| Fluorine-containing nonionic surfactant (Megafac F-177P, manufactured by Dainippon Ink & Chemicals, Inc.) | 0.02 g |
| Victoria Pure Blue | 0.04 g |
| Methyl ethyl ketone | 10 g |
| Methanol | 7 g |
| γ-butyrolactone | 10 g |

[Formation of Photosensitive Layer]

On the above-mentioned intermediate resin layer, the following photosensitive layer formation application liquid [III] was applied by a wire bar so that the total application amount of the intermediate resin layer and the photosensitive layer was 1.3 g/m$^2$, dried at 120° C. in a hot air type drying machine for 50 seconds to form a photosensitive layer, obtaining a planographic printing plate precursor of Example 44. Further on the resulted photosensitive layer, a polyvinyl alcohol aqueous solution was applied to form a protective layer, obtaining a planographic printing plate precursor of Example 23, in the same manner as in Examples 33 to 42.

| (Photosensitive layer application liquid [III]) | |
|---|---|
| Addition-polymerizable compound [M-1] | 1.5 g |
| Binder [B-1] | 2.0 g |
| Light-heat converting agent [DX-1] | 0.1 g |
| Divalent onium salt [S-9] | 0.15 g |
| Fluorine-containing nonionic surfactant (Megafac F-177P, manufactured by Dainippon Ink & Chemicals, Inc.) | 0.02 g |
| Victoria Pure Blue | 0.04 g |
| Methyl ethyl ketone | 20 g |
| Methanol | 2 g |
| 2-methoxy-1-propanol | 10 g |

The resulted planographic printing plate precursors were exposed and developed under the same conditions as in Examples 23 to 33 to make planographic printing plates, and the sensitivity was evaluated likewise. As the developer here, the above-mentioned developer D-1 (diluted with water at a ratio of 1:5) was used.

As a result of evaluation, it was confirmed that the sensitivity was 75 mJ/cm$^2$ in Example 44 and the sensitivity was 70 mJ/cm$^2$ in Example 45, and the planographic printing plate precursor of the present invention was excellent in sensitivity even in embodiments in which an intermediate resin layer was provided.

A negative planographic printing plate precursor of the present invention performed an effect that inscription by infrared laser was possible and sensitivity in recording is excellent.

What is claimed is:

1. A heat sensitive composition comprising: (A-I) a compound which is represented by the following general formula (I), and generates a radical by heat, and (B-I) a compound having at least one of physical and chemical properties, which are changed irreversibly by a radical;

$R—SO_2^-M^+$ general formula (I)

wherein R represents one of an alkyl group and aryl group, and $M^+$ represents a counter cation selected from sulfonium, iodonium, diazonium, ammonium and azinium.

2. A heat sensitive composition according to claim 1, wherein the heat sensitive composition further comprises: (C-I) a light-heat converting agent, and due to exposure to light of an absorption wavelength of the light-heat converting agent (C-I), the radical is generated from the compound (A-I), wherein the radical changes at least one of the physical and chemical properties of the compound (B-I).

3. A heat sensitive composition according to claim 2, wherein the light-heat converting agent (C-I) is at least one of an infrared absorbing dye and a pigment having an absorption maximum in the range of from 760 nm to 1200 nm.

4. A heat sensitive composition according to claim 2, wherein the light-heat converting agent (C-I) comprises at least one dye selected from the following general formulae (a) to (d):

General formula (a)

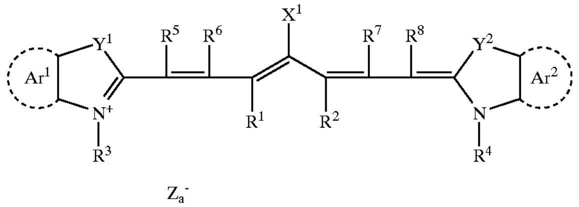

in the general formula (a), $X^1$ represents a hydrogen atom, halogen atom, $—NPh_2$, $X^2—L^1$ or a group shown below; $X^2$ represents an oxygen atom or sulfur atom; and $L^1$ represents a hydrocarbon group having 1 to 12 carbon atoms, an aromatic ring having a hetero atom, or a hydrocarbon group having 1 to 12 carbon atoms containing a hetero atom, and the hetero atom denotes N, S, O, halogen atom or Se, formula

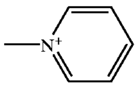

wherein $R^1$ and $R^2$ each represents independently a hydrocarbon group having 1 to 12 carbon atoms;

General formula (b)

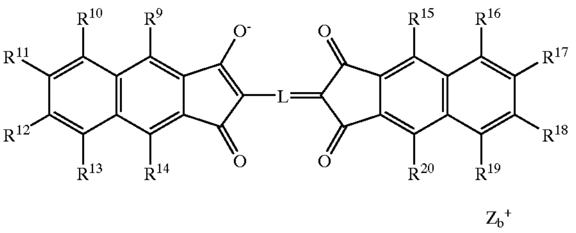

in the general formula (b), L represents a methine chain having 7 or more conjugated carbon atoms, which the methine chain may have substituents, and the substituents may be connected to each other to form a ring structure; $Zb^+$ represents a counter ion; and $R^9$ to $R^{14}$ and $R^{15}$ to $R^{20}$ each represents independently a hydrogen atom or a substituent selected from, or obtained by combining two or three of, halogen atoms, cyano groups, alkyl groups, aryl groups, alkenyl groups, alkynyl groups, carbonyl groups, thio groups, sulfonyl groups, sulfinyl groups, oxy groups and amino groups, and may be connected mutually to form a ring structure;

General formula (c)

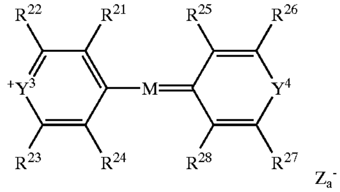

in the general formula (c), $Y^3$ and $Y^4$ each represents an oxygen atom, sulfur atom, selenium atom or tellurium atom; M represents a methine chain having 5 or more conjugated carbon atoms; $R^{21}$ to $R^{24}$ and $R^{25}$ to $R^{28}$ may be the same or different, and each represents independently a hydrogen atom, halogen atom, cyano group, alkyl group, aryl group, alkenyl group, alkynyl group, carbonyl group, thio group, sulfonyl group, sulfinyl group, oxy group or amino group; and $Za^-$ represents a counter anion and has the same definition as for $Za^-$ in the general formula (a);

General formula (d)

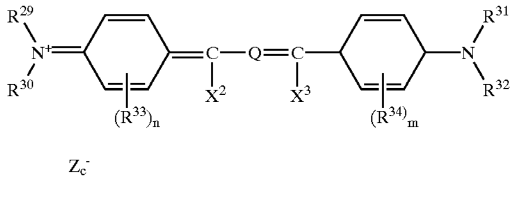

in the general formula (d), $R^{29}$ and $R^{31}$ each represents independently a hydrogen atom, alkyl group or aryl group; $R^{33}$ and $R^{34}$ each represents independently an alkyl group, substituted oxy group or halogen atom; n and m each represents independently an integer of 0 to 4; $R^{29}$ and $R^{30}$ or $R^{31}$ and $R^{32}$ may be connected to form a ring, or at least one of $R^{29}$ and $R^{30}$ may be connected with $R^{33}$ to form a ring or at least one of $R^{31}$ and $R^{32}$ may be connected with $R^{34}$ to form a ring, and further, when a plurality of $R^{33}$s or $R^{34}$s are present, $R^{33}$s may be connected to each other to form a ring or $R^{34}$s maybe connected to each other to form a ring; $X^2$ and $X^3$ each represents independently a hydrogen atom, alkyl group or aryl group, and at least one of $X^2$ and $X^3$ represents a hydrogen atom or alkyl group; Q represents a trimethine group or pentamethine group optionally having a substituent, and may form a ring structure with a divalent organic group; and $Zc^-$ represents a counter anion and has the same definition as for $Za^-$ in the general formula (a).

5. A heat sensitive composition according to claim 1, wherein said irreversible change is at least one selected from the group consisting of a hardening reaction, coloration and decoloration.

6. A heat sensitive composition according to claim 1, wherein the compound (B-I) includes a polymerizable unsaturated group, and $M^+$ in the general formula (I) is a counter cation which is one of sulfonium and iodonium.

7. A heat sensitive composition according to claim 1, wherein the compound (A-I) of the general formula (I) is comprised in an amount of 0.5 to 20% by weight based on total solid components of the heat sensitive composition.

8. A heat sensitive composition according to claim 1, wherein the compound (B-I) is comprised in an amount of 10 to 80% by weight based on total solid components of the heat sensitive composition.

9. A heat sensitive composition according to claim 1, wherein the physical and chemical properties of the compound (B-I) are selected from the group consisting of absorption spectrum, chemical structure, polarity, solubility, strength, refractive index, flowability and stickiness.

10. A heat mode compatible planographic printing plate precursor comprising a substrate having disposed thereon a recording layer containing the heat sensitive composition according to claim 1.

* * * * *